US011798619B2

(12) United States Patent
Tran et al.

(10) Patent No.: US 11,798,619 B2
(45) Date of Patent: Oct. 24, 2023

(54) PRECISION TUNING OF A PAGE OR WORD OF NON-VOLATILE MEMORY CELLS IN AN ANALOG NEURAL MEMORY SYSTEM

(71) Applicant: Silicon Storage Technology, Inc., San Jose, CA (US)

(72) Inventors: Hieu Van Tran, San Jose, CA (US); Thuan Vu, San Jose, CA (US); Stephen Trinh, San Jose, CA (US); Stanley Hong, San Jose, CA (US); Anh Ly, San Jose, CA (US); Steven Lemke, Boulder Creek, CA (US); Vipin Tiwari, Dublin, CA (US); Nhan Do, Saratoga, CA (US)

(73) Assignee: SILICON STORAGE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 17/857,113

(22) Filed: Jul. 4, 2022

(65) Prior Publication Data

US 2022/0336011 A1 Oct. 20, 2022

Related U.S. Application Data

(62) Division of application No. 17/024,410, filed on Sep. 17, 2020, now Pat. No. 11,532,354.

(Continued)

(51) Int. Cl.
*G11C 11/54* (2006.01)
*G11C 16/04* (2006.01)

(Continued)

(52) U.S. Cl.
CPC ............. *G11C 11/54* (2013.01); *G06N 3/065* (2023.01); *G11C 16/0483* (2013.01);
(Continued)

(58) Field of Classification Search
CPC ..... G11C 11/54; G11C 16/0483; G11C 16/08; G11C 16/10; G11C 16/16; G11C 16/3418; G06N 3/065
See application file for complete search history.

(56) References Cited

U.S. PATENT DOCUMENTS 5,029,130 A 7/1991 Yeh
6,160,739 A 12/2000 Wong
(Continued)

FOREIGN PATENT DOCUMENTS

CN 1658329 8/2005
TW 200643961 12/2006
(Continued)

OTHER PUBLICATIONS

U.S. Appl. No. 62/981,757 entitled "Ultra-Precise Tuning of Analog Neural Memory Cells in a Deep Learning Artificial Neural Network," filed Feb. 26, 2020, Lemke, et al.
(Continued)

*Primary Examiner* — Tuan T Nguyen
(74) *Attorney, Agent, or Firm* — DLA PIPER LLP US

(57) ABSTRACT

Numerous examples for performing tuning of a page or a word of non-volatile memory cells in an analog neural memory are disclosed. In one example, a method comprises programming a word or page of non-volatile memory cells in an analog neural memory system; and identifying any fast bits in the word or page of non-volatile memory cells.

7 Claims, 36 Drawing Sheets

Related U.S. Application Data

(60) Provisional application No. 62/993,008, filed on Mar. 22, 2020.

(51) Int. Cl.
    *G11C 16/08*      (2006.01)
    *G11C 16/16*      (2006.01)
    *G11C 16/34*      (2006.01)
    *G11C 16/10*      (2006.01)
    *G06N 3/065*      (2023.01)

(52) U.S. Cl.
    CPC .............. *G11C 16/08* (2013.01); *G11C 16/10* (2013.01); *G11C 16/16* (2013.01); *G11C 16/3418* (2013.01); *G11C 2216/04* (2013.01)

(56) References Cited

U.S. PATENT DOCUMENTS

| | | | |
|---|---|---|---|
| 6,643,185 B1 * | 11/2003 | Wang | G11C 16/3404 365/185.27 |
| 6,747,310 B2 | 6/2004 | Fan et al. | |
| 9,361,995 B1 | 6/2016 | Tran et al. | |
| 10,026,486 B1 | 7/2018 | Dutta | |
| 2013/0176783 A1 * | 7/2013 | Senoo | G11C 16/20 365/185.29 |
| 2014/0037086 A1 * | 2/2014 | Seol | G06F 7/588 708/250 |
| 2014/0119122 A1 | 5/2014 | Park | |
| 2017/0337466 A1 | 5/2017 | Bayat et al. | |
| 2021/0005261 A1 | 1/2021 | Shin | |
| 2021/0264983 A1 * | 8/2021 | Lemke | G11C 16/0408 |
| 2023/0022531 A1 * | 1/2023 | Hsu | G11C 16/24 |

FOREIGN PATENT DOCUMENTS

| | | |
|---|---|---|
| TW | 200733114 | 9/2007 |
| TW | 201027548 | 7/2010 |
| TW | 201133492 | 10/2011 |
| TW | 201230045 | 7/2012 |
| TW | 201333957 | 8/2013 |
| TW | 201933361 | 8/2019 |
| WO | 2017 200888 | 11/2017 |

OTHER PUBLICATIONS

Taiwanese Office Action dated Mar. 16, 2022 corresponding to the related Taiwanese Patent Application No. 110108871.

Taiwanese Office Action dated Jul. 14, 2023 corresponding to the related Taiwanese Patent Application No. 110108871.

* cited by examiner

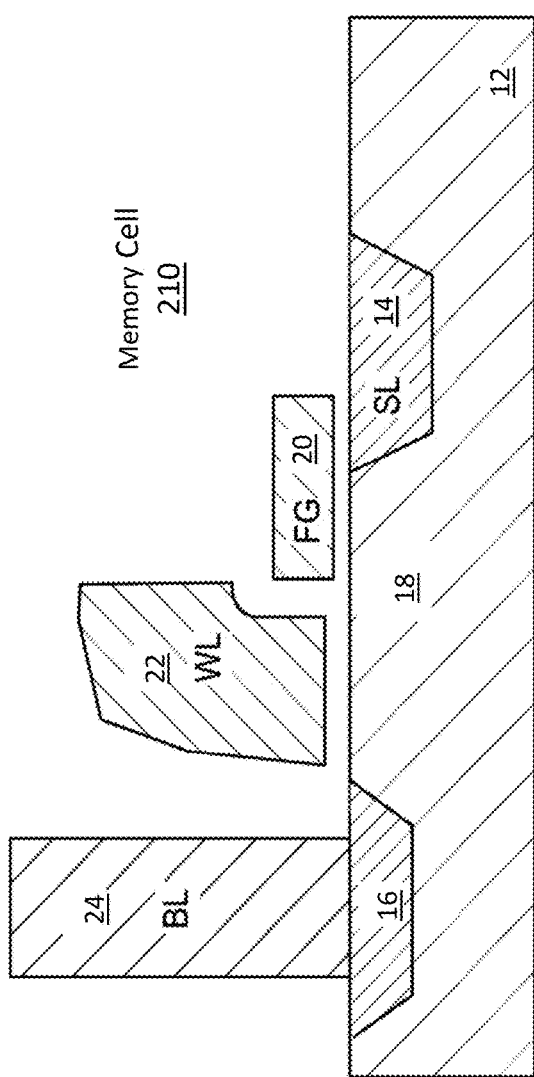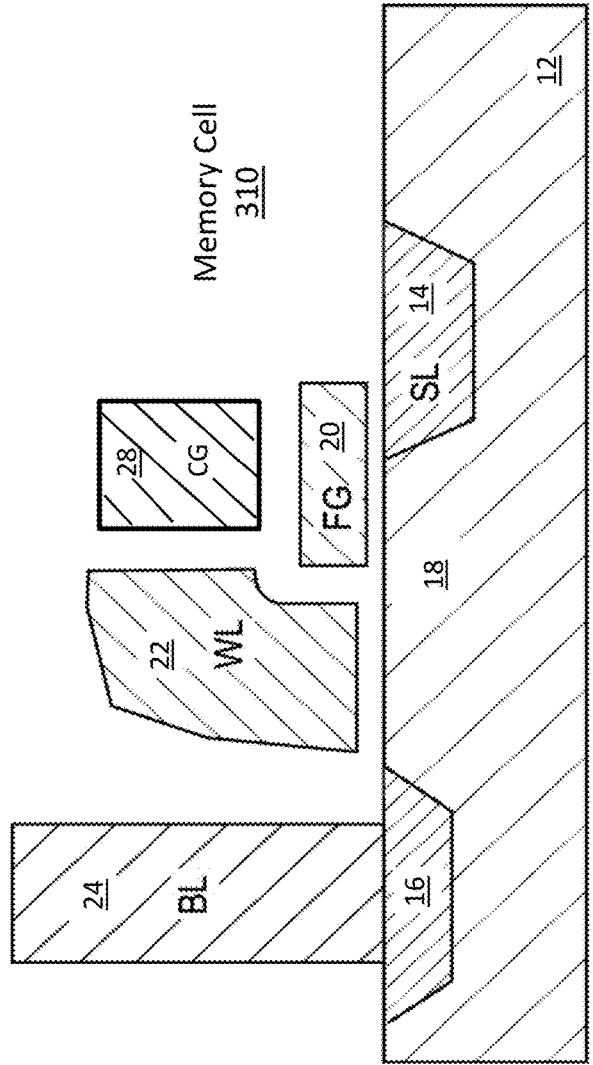
FIGURE 2
(PRIOR ART)
FIGURE 3
(PRIOR ART)

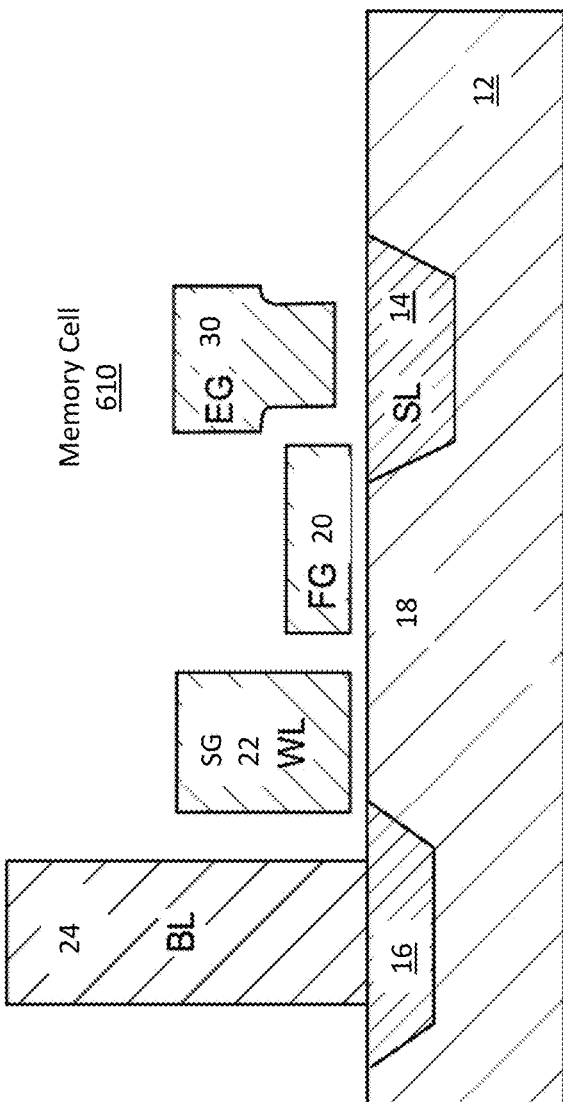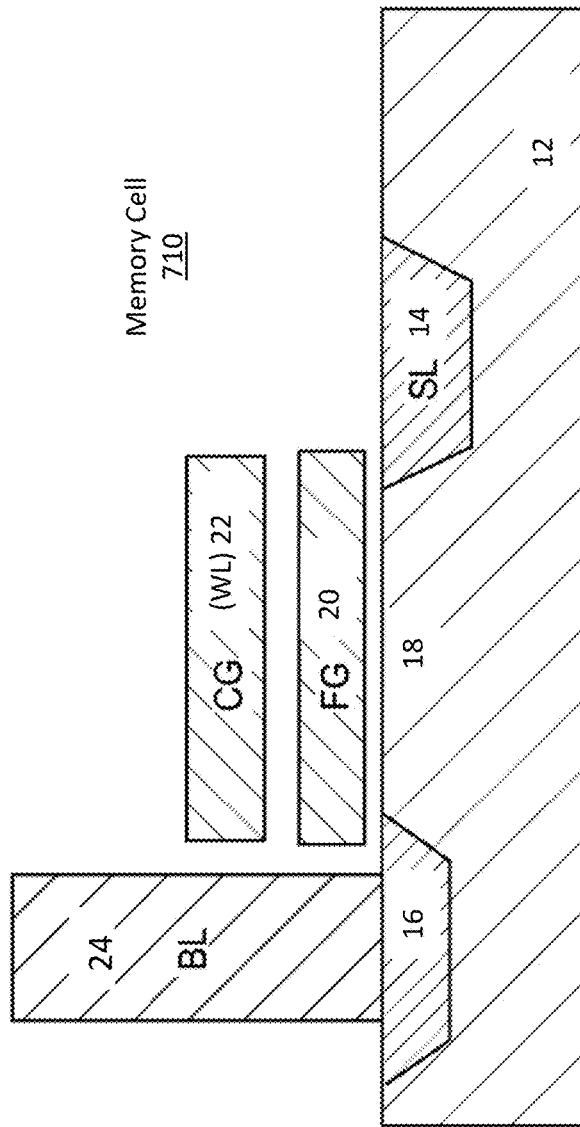
FIGURE 6
(PRIOR ART)
FIGURE 7
(PRIOR ART)

High Voltage Maximum Circuit 2400

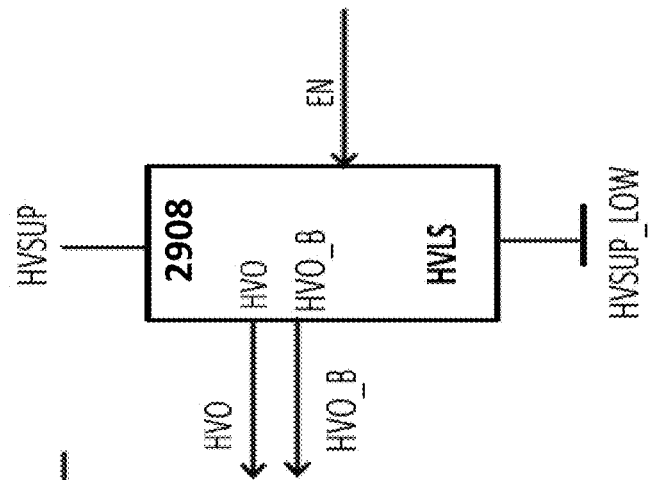
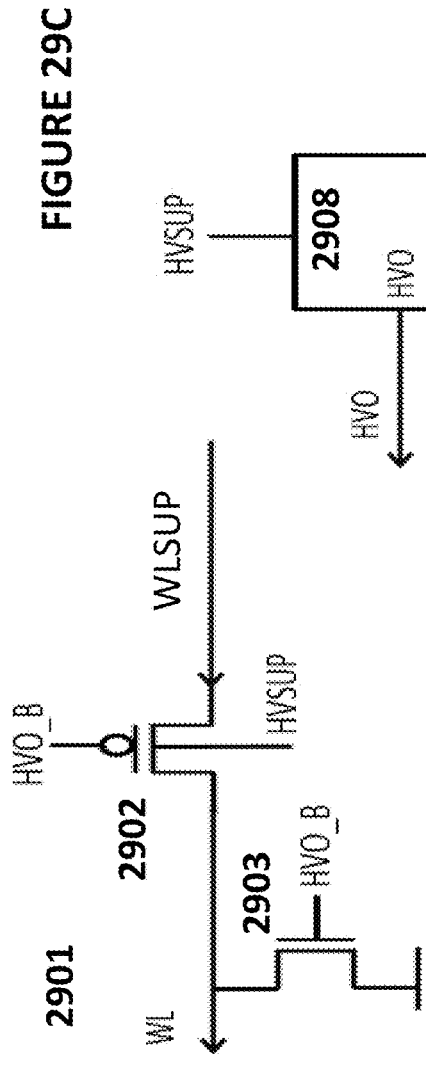
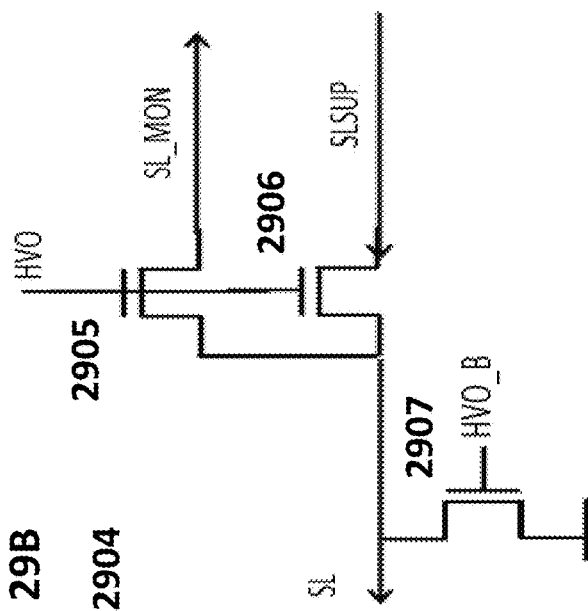
FIGURE 29A
FIGURE 29B
FIGURE 29C

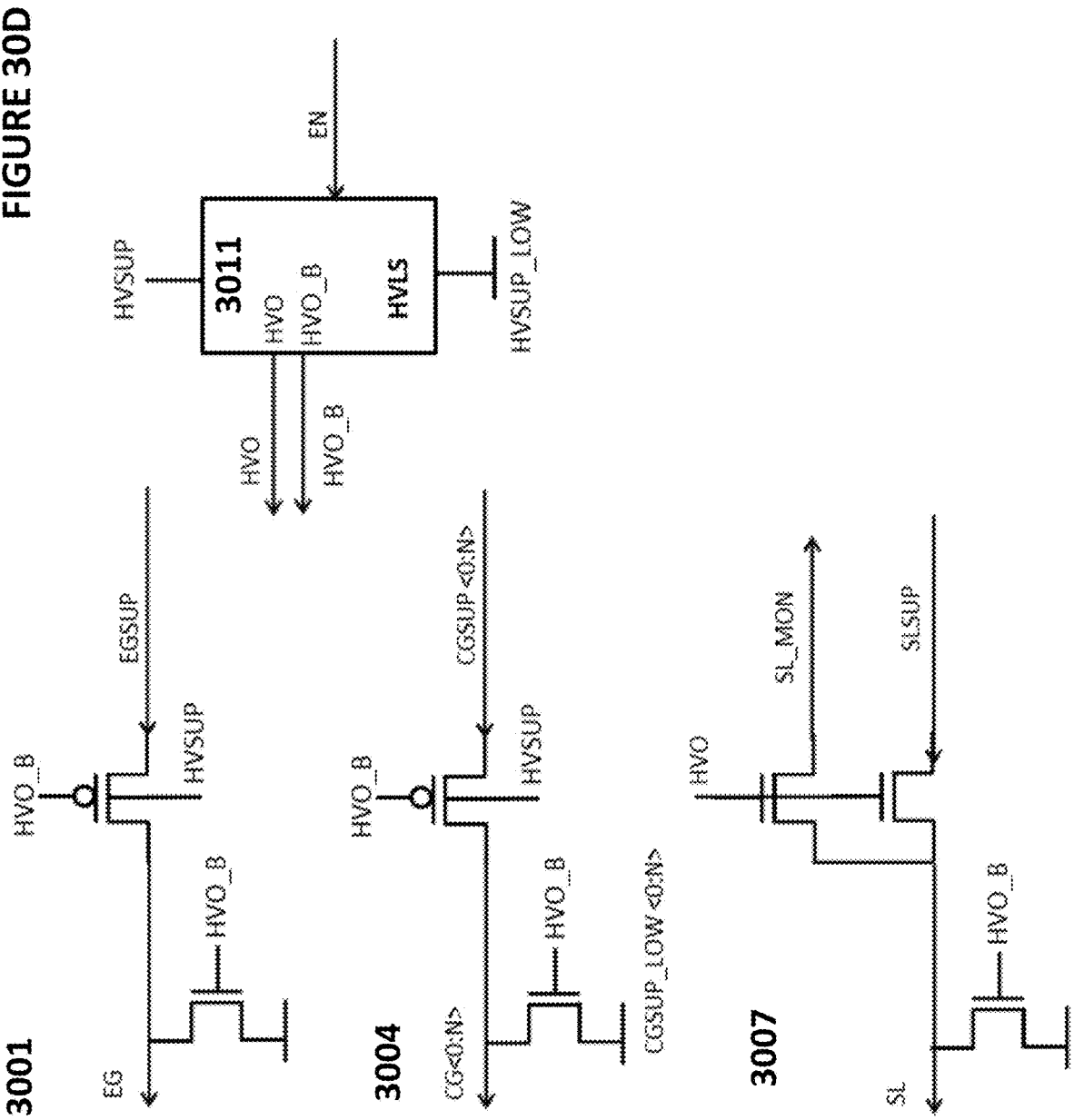

PRECISION TUNING OF A PAGE OR WORD OF NON-VOLATILE MEMORY CELLS IN AN ANALOG NEURAL MEMORY SYSTEM

PRIORITY CLAIM

This application is a divisional of U.S. patent application Ser. No. 17/024,410, filed on Sep. 17, 2020, and titled, "Precision Tuning of a Page or Word of Non-Volatile Memory Cells And Associated High Voltage Circuits for an Analog Neural Memory Array in an Artificial Neural Network," which claims priority to U.S. Provisional Patent Application No. 62/993,008, filed on Mar. 22, 2020, and titled "Precision Tuning of a Page or Word of Non-Volatile Memory Cells And Associated High Voltage Circuits for an Analog Neural Memory Array in an Artificial Neural Network," which are incorporated by reference herein.

FIELD OF THE INVENTION

Numerous examples for performing precision tuning of a page or word of non-volatile memory cells in an analog neural memory system are disclosed.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes the artificial neural network adaptive to inputs and capable of learning. Typically, artificial neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical artificial neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, published as US Patent Publication 2017/0337466, which is incorporated by reference. The non-volatile memory arrays operate as an analog neuromorphic memory. The term neuromorphic, as used herein, means circuitry that implement models of neural systems. The analog neuromorphic memory includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs. An array of memory cells arranged in this manner can be referred to as a vector by matrix multiplication (VMM) array.

Examples of different non-volatile memory cells that can be used in VMMs will now be discussed.

Non-Volatile Memory Cells

Various types of known non-volatile memory cells can be used in the VMM arrays. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the drain region 16 towards the source region 14 (source line terminal). The electrons will accelerate and become energized (heated) when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE No. 1

Operation of Flash Memory Cell 210 of FIG. 2

|  | WL | BL | SL |
|---|---|---|---|
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 μA | 9-10 V |

"Read 1" is a read mode in which the cell current is output on the bit line. "Read 2" is a read mode in which the cell current is output on the source line terminal.

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0 v/−8V, low or mid range in read, e.g., 0 v/2.5V. Other terminals are biased similarly to that of FIG. 2.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE No. 2

Operation of Flash Memory Cell 410 of FIG. 4

|  | WL/SG | BL | CG | EG | SL |
|---|---|---|---|---|---|
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 μA | 8-11 V | 4.5-9 V | 4.5-5 V |

"Read 1" is a read mode in which the cell current is output on the bit line. "Read 2" is a read mode in which the cell current is output on the source line terminal.

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE No. 3

Operation of Flash Memory Cell 610 of FIG. 6

|  | WL/SG | BL | EG | SL |
|---|---|---|---|---|
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | −0.5 V/0 V | 0 V | 11.5 V | 0 V |
| Program | 1 V | 2-3 μA | 4.5 V | 7-9 V |

"Read 1" is a read mode in which the cell current is output on the bit line. "Read 2" is a read mode in which the cell current is output on the source line terminal.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). Programming is performed using hot electron injection from channel 18 to floating gate 20 in the channel region next to the drain region 16, and erasing is performed using by Fowler-Nordheim electron tunneling from floating gate 20 to substrate 12. The read operations operate in a similar manner to that described previously for memory cell 210.

Table No. 4 depicts typical voltage ranges that can be applied to the terminals of memory cell 710 and substrate 12 for performing read, erase, and program operations:

TABLE No. 4

Operation of Flash Memory Cell 710 of FIG. 7

|  | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line. "Read 2" is a read mode in which the cell current is output on the source line terminal. Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

FIG. 8 depicts twin split-gate memory cell 810. Memory cell 810 comprises floating gate (FG) 20 disposed over and insulated from the substrate 12, a control gate 28 (CG) disposed over and insulated from the floating gate 20, an erase gate 30 (EG) disposed adjacent to and insulated from the floating and control gates 20/28 and disposed over and insulated from the substrate 12, where the erase gate 30 is created with a T shape such that a top corner of the control gate CG faces the inside corner of the T shaped erase gate to improve erase efficiency, and a drain region 16 (DR) in the substrate adjacent the floating gate 20 (with a bit line contact 24 (BL) connected to the drain diffusion regions 16 (DR)). The memory cells are formed as pairs of memory cells (A on the left and B on the right), sharing a common erase gate 30. This cell design differs from that the memory cells discussed above with reference to FIGS. 2-7 at least in that it lacks a source region under the erase gate EG, lacks a select gate (also referred to as a word line), and lacks a channel region for each memory cell. Instead, a single continuous channel region 18 extends under both memory cells (i.e. extends from the drain region 16A of one memory cell to the drain region 16B of the other memory cell). To read or program one memory cell, the control gate 28 of the other memory cell is raised to a sufficient voltage to turn on the underlying channel region portion via voltage coupling to the floating gate 20 there between (e.g. to read or program cell A, the voltage on FGB 20B is raised via voltage coupling from CGB 28B to turn on the channel region portion under FGB 20B). Erasing is performed using Fowler Nordheim electron tunneling from floating gate 20 to erase gate 30. Programming is performed using hot electron injection from channel 18 to floating gate 20, this is indicated as PROGRAM 1 in Table 5. Alternatively programming is performed using Fowler Nordheim electron tunneling from erase gate 30 to floating gate 20, this is indicated as PROGRAM 2 in Table 5. Alternatively programming is performed using Fowler Nordheim electron tunneling from channel 18 to floating gate 20, in this case the condition is similar to PROGRAM 2 except the substrate 12 is biased at a low voltage or negative voltage while erase gate 30 is biased at a low positive voltage.

Table No. 5 depicts typical voltage ranges that can be applied to the terminals of memory cell 810 for performing read, erase, and program operations. In this Table, it is assumed that cell A (with terminals EG, CGA, and BLA) is selected for a read, program, or erase operation in each row memory cells. In another example, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as FINFET split gate flash or stack gate flash memory, NAND flash, 3D flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and other volatile synapse cells, without limitation.

Neural Networks Employing Non-Volatile Memory Cell Arrays

FIG. 9 conceptually illustrates a non-limiting example of a neural network utilizing a non-volatile memory array of the present examples. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of TABLE No. 5

Operation of Flash Memory Cell 810 of FIG. 8

|  | CGA | BLA | EG | CGB | BLB |
| --- | --- | --- | --- | --- | --- |
| READ1 | 1.5-4 V | 0.1-0.8 V | 2.5 V | 1.5-4 V | 0 |
| ERASE | 0 V to −8 V | 0 V | 8 V to 11.5 V | 0 V to 4 V (Vcginhe) | 0 V |
| PROGRAM 1 | 10.5 V | 4.5 V | 1.5 V | 4 | Iprog |
| PROGRAM 2 | 4 V to 11.5 V | 0 V | −4 V to −11.5 V | 0 V to −2 V (Vcginhp) | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 10 is a block diagram of a system that can be used for that purpose. VMM system 32 includes non-volatile memory cells and is utilized as the synapses (such as CB1, CB2, CB3, and CB4 in FIG. 6) between one layer and the next layer. Specifically, VMM system 32 comprises VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation. Weights of a filter (kernel) are mapped across one or multiple bitlines (columns) or one or multiple rows across single or multiple VMM arrays 33.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tanh, ReLU functions, or any other non-linear function. The rectified output values of activation function circuit 39 become an element of a feature map of the next layer (e.g. C1 in FIG. 9), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 10 (WLx, EGx, CGx, and optionally BLx and SLx) can be analog level, binary level, digital timing pulses (in which case a pulses-to-analog converter PAC may be needed to convert pulses to the appropriate input analog level) or digital bits (in which case a DAC is provided to convert digital bits to appropriate input analog level) and the output can be analog level (e.g., current, voltage, or charge), binary level, digital pulses, or digital bits (in which case an output ADC is provided to convert output analog level into digital bits).

FIG. 11 is a block diagram depicting the usage of numerous layers of VMM systems 32, here labeled as VMM systems 32a, 32b, 32c, 32d, and 32e. As shown in FIG. 11, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 11 contains five layers (32a, 32b, 32c, 32d, 32e): one input layer (32a), two hidden layers (32b, 32c), and two fully connected layers (32d, 32e). One of ordinary skill in the art will appreciate that this is merely exemplary and that a system instead could comprise more than two hidden layers and more than two fully connected layers.

VMM Arrays

FIG. 12 depicts neuron VMM array 1200, which is particularly suited for memory cells 310 as shown in FIG. 3, and is utilized as the synapses and parts of neurons between an input layer and the next layer. VMM array 1200 comprises memory array 1201 of non-volatile memory cells and reference array 1202 (at the top of the array) of non-volatile reference memory cells. Alternatively, another reference array can be placed at the bottom.

In VMM array 1200, control gate lines, such as control gate line 1203, run in a vertical direction (hence reference array 1202 in the row direction is orthogonal to control gate line 1203), and erase gate lines, such as erase gate line 1204, run in a horizontal direction. Here, the inputs to VMM array 1200 are provided on the control gate lines (CG0, CG1, CG2, CG3), and the output of VMM array 1200 emerges on the source lines (SL0, SL1). In one example, only even rows are used, and in another example, only odd rows are used. The current placed on each source line (SL0, SL1, respectively) performs a summing function of all the currents from the memory cells connected to that particular source line.

As described herein for neural networks, the non-volatile memory cells of VMM array 1200 are preferably configured to operate in a sub-threshold region.

The non-volatile reference memory cells and the non-volatile memory cells described herein are biased in weak inversion:

$$Ids = Io * e^{(Vg-Vth)/nVt} = w*Io*e^{(Vg)/nVt},$$

where $w = e^{(-Vth)/nVt}$ where Ids is the drain to source current; Vg is gate voltage on the memory cell; Vth is the (effective or equivalent) threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg = n*Vt*\log[Ids/wp*Io]$$

Here, wp is w of a reference or peripheral memory cell.

For a memory array used as a vector matrix multiplier VMM array, the output current is:

$$Iout = wa*Io*e^{(Vg)/nVt}, \text{ namely}$$

$$Iout = (wa/wp)*Iin = W*Iin$$

$$W = wa/wp = e^{(Vthp-Vtha)/nVt}$$

$$Iin = wp*Io* e^{(Vg)/nVt}$$

Here, wa=W of each memory cell in the memory array. Vthp is the (equivalent or effective) threshold voltage of reference memory cell (or peripheral memory cell or transistor) and Vtha is the (equivalent or effective) threshold voltage of the array memory cell.

A wordline or control gate can be used as the input for the memory cell for the input voltage.

Alternatively, the non-volatile memory cells of VMM arrays described herein can be configured to operate in the linear region:

$$Ids = \text{beta}*(Vgs-Vth)*Vds; \text{ beta}=u*Cox*Wt/L,$$

$$W\alpha(Vgs-Vth),$$

meaning weight W in the linear region is proportional to (Vgs–Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$$Ids = \tfrac{1}{2}*\text{beta}*(Vgs-Vth)^2; \text{ beta}=u*Cox*Wt/L$$

$W\alpha(Vgs-Vth)^2$, meaning weight W is proportional to $(Vgs-Vth)^2$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

FIG. 13 depicts neuron VMM array 1300, which is particularly suited for memory cells 210 as shown in FIG. 2, and is utilized as the synapses between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1314 (only partially depicted) with current inputs flowing into them. The reference cells are tuned (e.g., programmed) to target reference levels. The target reference levels are provided by a reference mini-array matrix (not shown) or from a bandgap based reference circuit.

Memory array 1303 serves two purposes. First, it stores the weights that will be used by the VMM array 1300 on respective memory cells thereof. Second, memory array 1303 effectively multiplies the inputs (i.e. current inputs provided in terminals BLR0, BLR1, BLR2, and BLR3, which reference arrays 1301 and 1302 convert into the input voltages to supply to wordlines WL0, WL1, WL2, and WL3)

by the weights stored in the memory array 1303 and then adds all the results (memory cell currents) to produce the output on the respective bit lines (BL0-BLN), which will be the input to the next layer or input to the final layer. By performing the multiplication and addition function, memory array 1303 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

TABLE 6

Operation of VMM Array 1300 of FIG. 13:

|  | WL | WL-unsel | BL | BL-unsel | SL | SL-unsel |
|---|---|---|---|---|---|---|
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 14 depicts neuron VMM array 1400, which is particularly suited for memory cells 210 as shown in FIG. 2, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 run in row direction of the VMM array 1400. VMM array is similar to VMM 1300 except that in VMM array 1400, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 7 depicts operating voltages for VMM array 1400. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 of first non-volatile reference memory cells, and reference array 1502 of second non-volatile reference memory cells. Reference arrays 1501 and 1502 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1512 (only partially shown) with current inputs flowing into them through BLR0, BLR1, BLR2, and BLR3. Multiplexors 1512 each include a respective multiplexor 1505 and a cascoding transistor 1504 to ensure a constant voltage on the bitline (such as BLR0) of each of the first and second non-volatile reference memory cells during a read operation. The reference cells are tuned to target reference levels.

Memory array 1503 serves two purposes. First, it stores the weights that will be used by the VMM array 1500. Second, memory array 1503 effectively multiplies the inputs (current inputs provided to terminals BLR0, BLR1, BLR2, and BLR3, for which reference arrays 1501 and 1502 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1500 implements uni-directional tuning for non-volatile memory cells in memory array 1503. That is, each non-volatile memory cell is erased and then partially programmed until the desired charge on the floating gate is reached. This can be performed, for example, using the precision programming techniques described below. If too much charge is placed on the floating gate (such that the

TABLE 7

Operation of VMM Array 1400 of FIG. 14

|  | WL | WL-unsel | BL | BL-unsel | SL | SL-unsel |
|---|---|---|---|---|---|---|
| Read | 0.5-3.5 V | −0.5 V/0 V | 0.1-2 V | 0.1 V-2 V/FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT | wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE 8

| | | | | | | | | | | | |
|---|---|---|---|---|---|---|---|---|---|---|---|
| | \multicolumn{11}{c}{Operation of VMM Array 1500 of FIG. 15} |
| | WL | WL-unsel | BL | BL-unsel | CG | CG-unsel same sector | CG-unsel | EG | EG-unsel | SL | SL-unsel |
| Read | 0.5-2 V | −0.5 V/ 0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/ 0 V | Vinh 0.1-1 uA | (1-2 V) | 4-11 V | 0-2.6 V | 0-2.6 V | 4.5-5 V | 0-2.6 V | 4.5-5 V | 0-1 V |

FIG. 16 depicts neuron VMM array 1600, which is particularly suited for memory cells 310 as shown in FIG. 3, and is utilized as the synapses and parts of neurons between an input layer and the next layer. VMM array 1600 comprises a memory array 1603 of non-volatile memory cells, reference array 1601 or first non-volatile reference memory cells, and reference array 1602 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1600 is similar to VMM array 1600, except that VMM array 1600 implements bi-directional tuning, where each individual cell can be completely erased, partially programmed, and partially erased as needed to reach the desired amount of charge on the floating gate due to the use of separate vertical EG lines. As shown, reference arrays 1601 and 1602 convert input current in the terminal BLR0, BLR1, BLR2, and BLR3 into control gate voltages CG0, CG1, CG2, and CG3 (through the action of diode-connected reference cells through multiplexors 1614) to be applied to the memory cells in the row direction. The current output (neuron) is in the bitlines BL0-BLN, where each bit line sums all currents from the non-volatile memory cells connected to that particular bitline.

Table No. 9 depicts operating voltages for VMM array 1600. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE 9

| | | | | | | | | | | | |
|---|---|---|---|---|---|---|---|---|---|---|---|
| | \multicolumn{11}{c}{Operation of VMM Array 1600 of FIG. 16} |
| | WL | WL-unsel | BL | BL-unsel | CG | CG-unsel same sector | CG-unsel | EG | EG-unsel | SL | SL-unsel |
| Read | 1.0-2 V | −0.5 V/ 0 V | 0.6-2 V (Ineuron) | 0 V/ FLT | 0-2.6 V | 0-2.6 V | 0-2.6 V | 0-2.6 V | 0-2.6 V | 0 V | 0 V/FLT |

TABLE 9-continued

Operation of VMM Array 1600 of FIG. 16

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/ 0 V | 0.1-1 uA | Vinh (1-2 V) | 4-11 V | 0-2.6 V | 0-2.6 V | 4.5-5 V | 0-2.6 V | 4.5-5 V | 0-1 V |

The input to the VMM arrays can be an analog level, a binary level, timing pulses, or digital bits and the output can be an analog level, a binary level, timing pulses, or digital bits (in this case an output ADC is needed to convert output analog level current or voltage into digital bits).

For each memory cell in a VMM array, each weight W can be implemented by a single memory cell or by a differential cell or by two blend memory cells (average of 2 or more cells). In the differential cell case, two memory cells are needed to implement a weight w as a differential weight (w=w+−w−). In the two blend memory cells, two memory cells are needed to implement a weight w as an average of two cells.

It imperative to accurately and precisely program and erase non-volatile memory cells to ensure that the correct amount of charged is placed on the floating gates to store the correct weight in the cell.

What is needed is a VMM system that allows for precise tuning on a word or page basis, where a word typically comprises 8-64 memory cells each storing multiple logical bits (i.e., multi-level cells, each storing, for example, 3-8 bits) and a page comprises 64 memory cells each storing multiple logical bits. What is further needed are high voltage circuits to generate the required voltages. What is further needed are improved programming sequences to minimize the occurrence of undesired effects such as erase gate disturb and control gate disturb.

SUMMARY OF THE INVENTION

Numerous examples for performing precision tuning of a page or a word of non-volatile memory cells in an analog neural memory are disclosed. High voltage circuits used to generate high voltages applied to terminals of the non-volatile memory cells during the precision tuning process are also disclosed. Programming sequences for the application of the voltages to the terminals to minimize the occurrence of disturbances during precision tuning are also disclosed.

In one example, an analog neural memory system comprises an array of non-volatile memory cells arranged into rows and columns, each non-volatile memory cell comprising a word line terminal, a bit line terminal, and an erase gate terminal; a plurality of word lines, each word line coupled to word line terminals of a row of non-volatile memory cells; a plurality of bit lines, each bit line coupled to bit line terminals of a column of non-volatile memory cells; and a plurality of erase gate enable transistors, each erase gate enable transistor coupled to erase gate terminals of a word of non-volatile memory cells.

In another example, an analog neural memory system comprises an array of non-volatile memory cells arranged into rows and columns, each non-volatile memory cell comprising a word line terminal, a bit line terminal, and an erase gate terminal; a plurality of word lines, each word line coupled to word line terminals of a row of non-volatile memory cells; a plurality of bit lines, each bit line coupled to bit line terminals of a column of non-volatile memory cells; and a plurality of erase gate enable transistors, each erase gate enable transistor coupled to erase gate terminals of a page of non-volatile memory cells, the page comprising two words of non-volatile memory cells in adjacent rows.

In another example, an analog neural memory system comprises an array of non-volatile memory cells arranged into rows and columns, each non-volatile memory cell comprising a word line terminal, a bit line terminal, and an erase gate terminal; a plurality of word lines, each word line coupled to word line terminals of a row of non-volatile memory cells; a plurality of bit lines, each bit line coupled to bit line terminals of a column of non-volatile memory cells; and a plurality of erase gate lines, each erase gate line coupled to erase gate terminals of a page of non-volatile memory cells, the page comprising two words of non-volatile memory cells in adjacent rows.

In another example, a method of performing tuning on a word or a page of non-volatile memory cells, the method comprises erasing the word or page of non-volatile memory cells; performing soft programming of the word or page of non-volatile memory cells; performing coarse programming of the word or page of non-volatile memory cells; performing fine programming of the word or page of non-volatile memory cells; and identifying any fast bits in the word or page of non-volatile memory cells so that those bits can be programmed using a different sequence than the normal (non-fast and non-slow) bits.

In another example, a method of programming a word of non-volatile memory cells in an array of non-volatile memory cells arranged into rows and columns, each non-volatile memory cell comprising a control gate terminal, a source line terminal and an erase gate terminal, the method comprises ramping up a voltage on control gate terminals of the word of non-volatile memory cells during a first time period; ramping up a voltage on the source line terminal of the word of non-volatile memory cells during a second time period after the first time period; and ramping up a voltage on the erase gate line terminal of the word of non-volatile memory cells during a third time period after the second time period.

In another example, a method of programming a word of non-volatile memory cells in an array of non-volatile memory cells arranged into rows and columns, each non-volatile memory cell comprising a control gate terminal, a source line terminal and an erase gate terminal, the method comprises ramping up a voltage on control gate terminals of the word of non-volatile memory cells to an intermediate voltage during a first time period; ramping up a voltage on the source line terminal of the word of non-volatile memory cells during a second time period after the first time period; ramping up a voltage on the erase gate line terminal of the word of non-volatile memory cells during a third time period after the second time period; and further ramping up the voltage on control gate terminals of the word of non-volatile memory cells during a fourth time period after the third time period.

In another example, a method of programming a word of non-volatile memory cells in an array of non-volatile memory cells arranged into rows and columns, each non-volatile memory cell comprising a control gate terminal, a source line terminal and an erase gate terminal, the method comprises ramping up a voltage on control gate terminals of the word of non-volatile memory cells to a first intermediate voltage during a first time period; ramping up a voltage on the source line terminal of the word of non-volatile memory cells to a second intermediate voltage during a second time period after the first time period; and ramping up a voltage on the erase gate line terminal of the word of non-volatile memory cells and further ramping up the voltage on the source line terminals of the word of non-volatile memory cells and further ramping up the voltage on the control gate terminals of the word of non-volatile memory cells to a third intermediate voltage during a third time period after the second time period; and further ramping up the voltage on control gate terminals of the word of non-volatile memory cells during a fourth time period after the third time period.

In another example, a method of programming a word of non-volatile memory cells in an array of non-volatile memory cells arranged into rows and columns, each non-volatile memory cell comprising a control gate terminal, a source line terminal and an erase gate terminal, the method comprises ramping up a voltage on the source line terminal of the word of non-volatile memory cells during a first time period; and ramping up a voltage on the erase gate line terminal of the word of non-volatile memory cells and ramping up a voltage on control gate terminals of the word of non-volatile memory cells during a second time period after the first time period.

In another example, an analog neural memory system comprises an array of non-volatile memory cells arranged into rows and columns, each non-volatile memory cell comprising a word line terminal, a bit line terminal, and an erase gate terminal; a plurality of word lines, each word line coupled to word line terminals of a row of non-volatile memory cells; a plurality of bit lines, each bit line coupled to bit line terminals of a column of non-volatile memory cells; and a circuit decoder block comprising an erase gate decoder for providing an erase gate decoding signal, a control gate decoder for providing two control gate signals, and source line decoder that provides a source line decoding signal.

In another example, an analog neural memory system comprises an array of non-volatile memory cells arranged into rows and columns, each non-volatile memory cell comprising a word line terminal, a bit line terminal, and an erase gate terminal; a plurality of word lines, each word line coupled to word line terminals of a row of non-volatile memory cells; a plurality of bit lines, each bit line coupled to bit line terminals of a column of non-volatile memory cells; and a circuit decoder block comprising an erase gate decoder for providing an erase gate decoding signal, a control gate decoder for providing four control gate signals, and source line decoder that provides a source line decoding signal.

In another example, an analog neural memory system comprises an array of non-volatile memory cells arranged into rows and columns, each non-volatile memory cell comprising a word line terminal, a bit line terminal, and an erase gate terminal; a plurality of word lines, each word line coupled to word line terminals of a row of non-volatile memory cells; a plurality of bit lines, each bit line coupled to bit line terminals of a column of non-volatile memory cells; and a circuit decoder block comprising an erase gate decoder for providing two erase gate decoding signals, a control gate decoder for providing eight control gate signals, and a source line decoder that provides a source line decoding signal.

BRIEF DESCRIPTION OF THE DRAWINGS

FIG. 2 depicts a prior art split gate flash memory cell.
FIG. 3 depicts another prior art split gate flash memory cell
FIG. 6 depicts another prior art split gate flash memory cell.
FIG. 7 depicts a prior art stacked gate flash memory cell.
FIG. 29A-29C depict examples of high voltage decode circuits.
FIGS. 30A-30D depict examples of high voltage decode circuits.

DETAILED DESCRIPTION OF THE INVENTION

The artificial neural networks of the present invention utilize a combination of CMOS technology and non-volatile memory arrays.

Improved VMM Systems with Page or Word-Based Tuning

Figure 1:
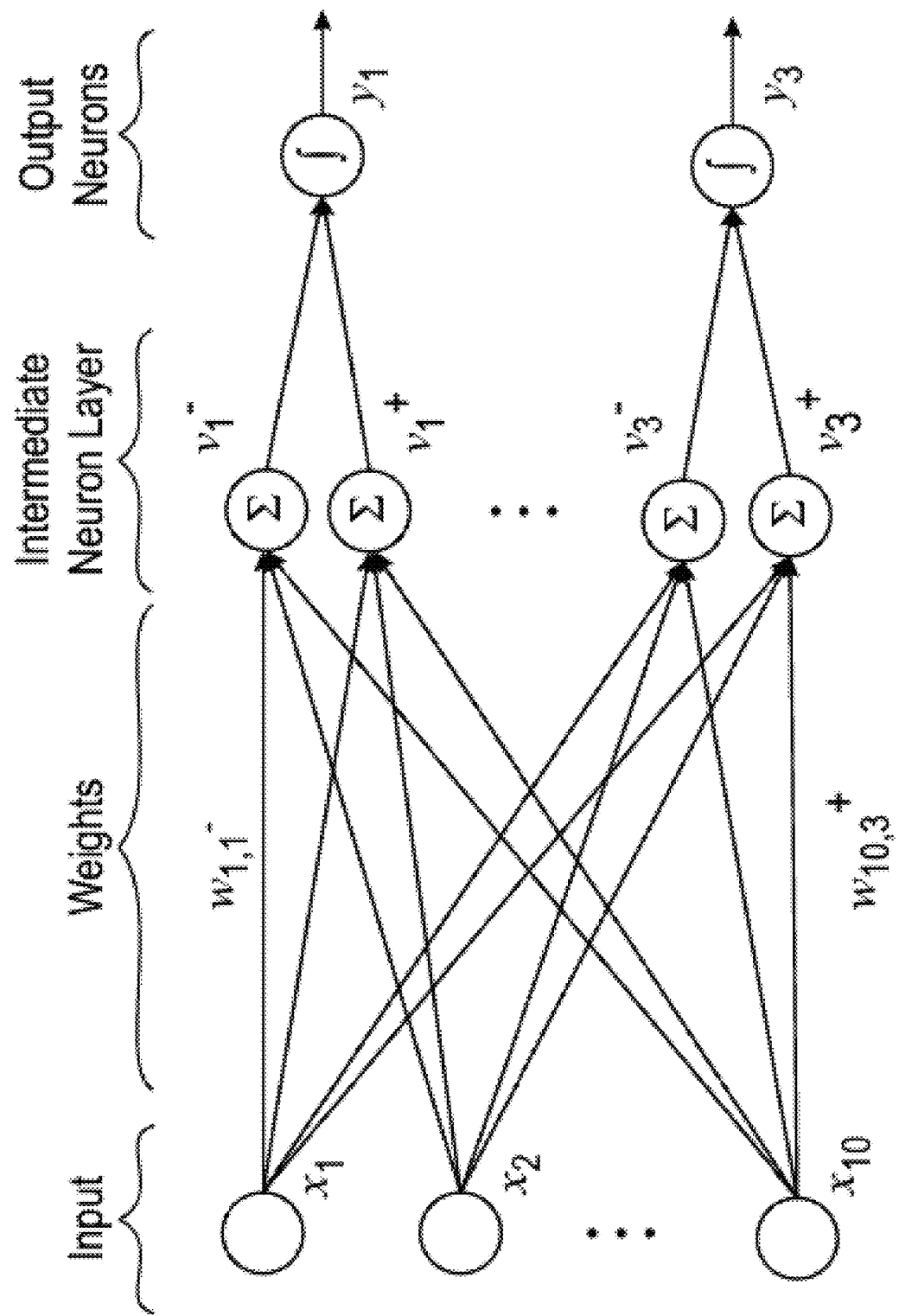
FIG. 1 depicts a prior art artificial neural network.
Figure 4:
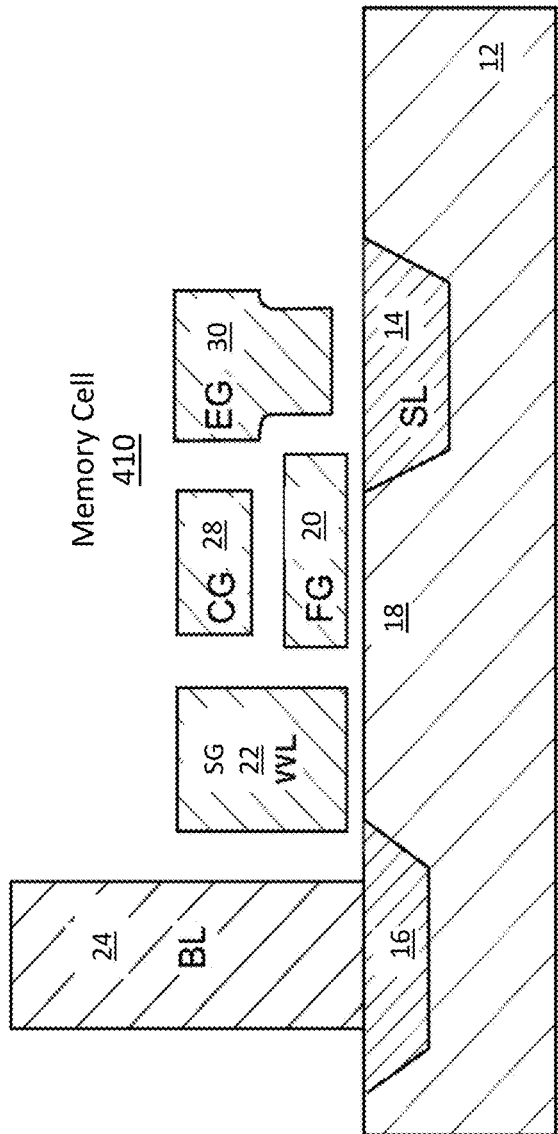
FIG. 4 depicts another prior art split gate flash memory cell.
Figure 5:
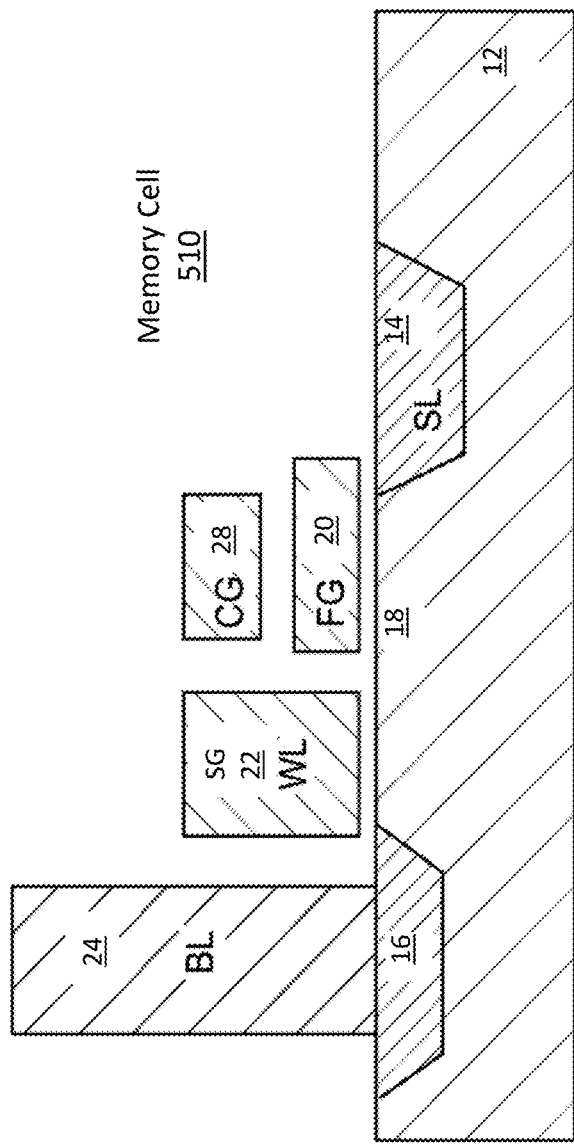
FIG. 5 depicts another prior art split gate flash memory cell.
Figure 8:
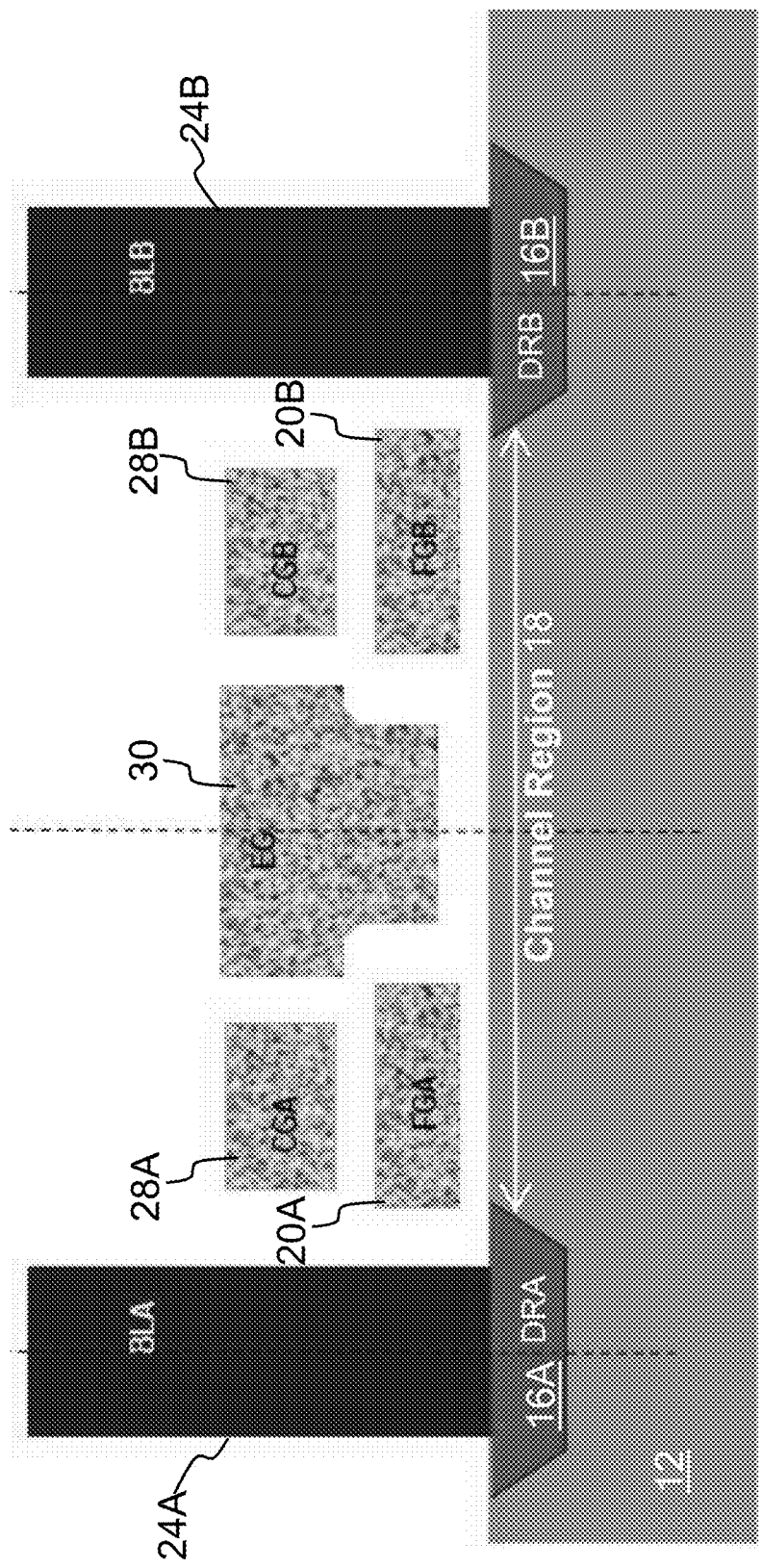
FIG. 8 depicts a prior art twin split-gate memory cell.
Figure 9:
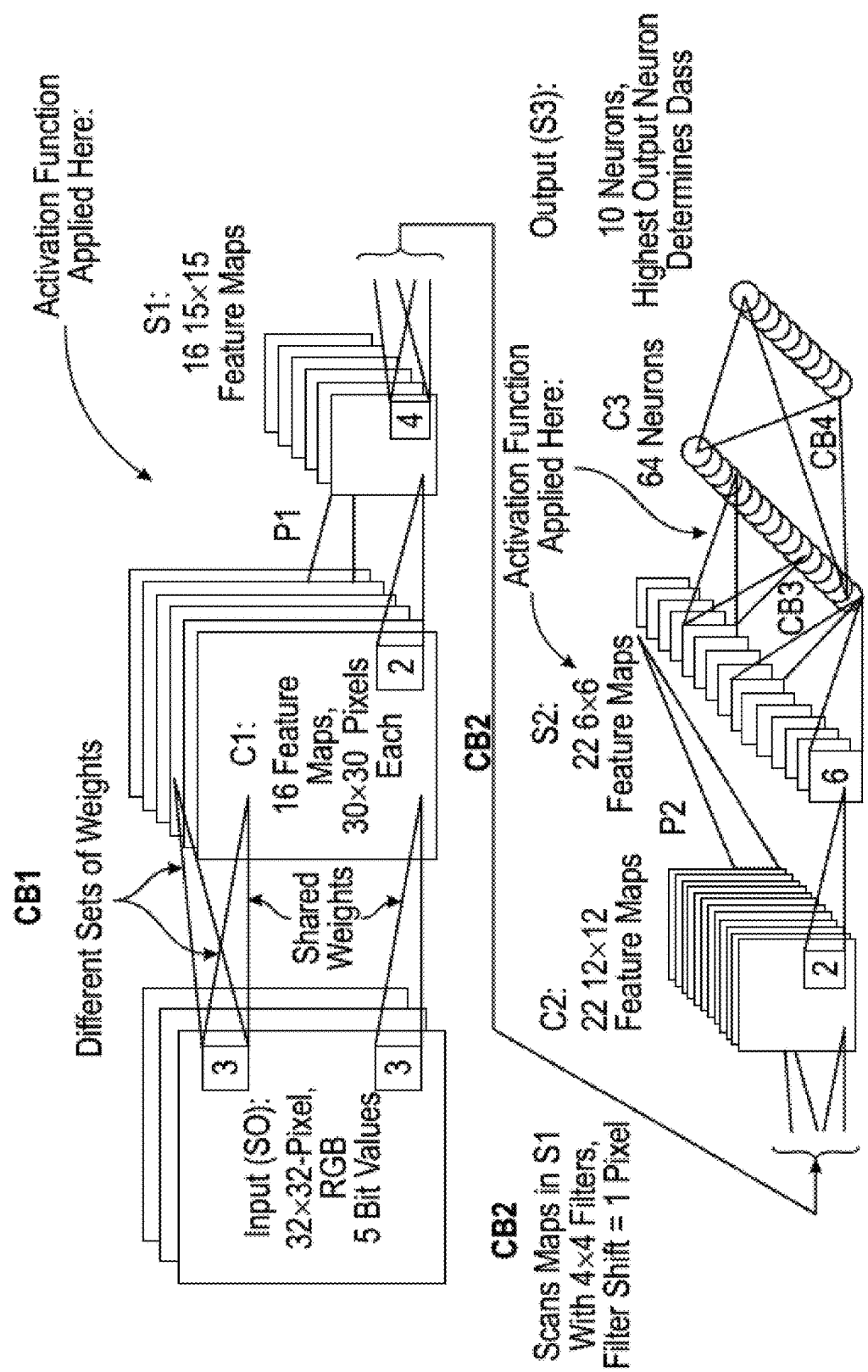
FIG. 9 depicts different levels of an exemplary artificial neural network utilizing one or more VMM arrays.
Figure 10:
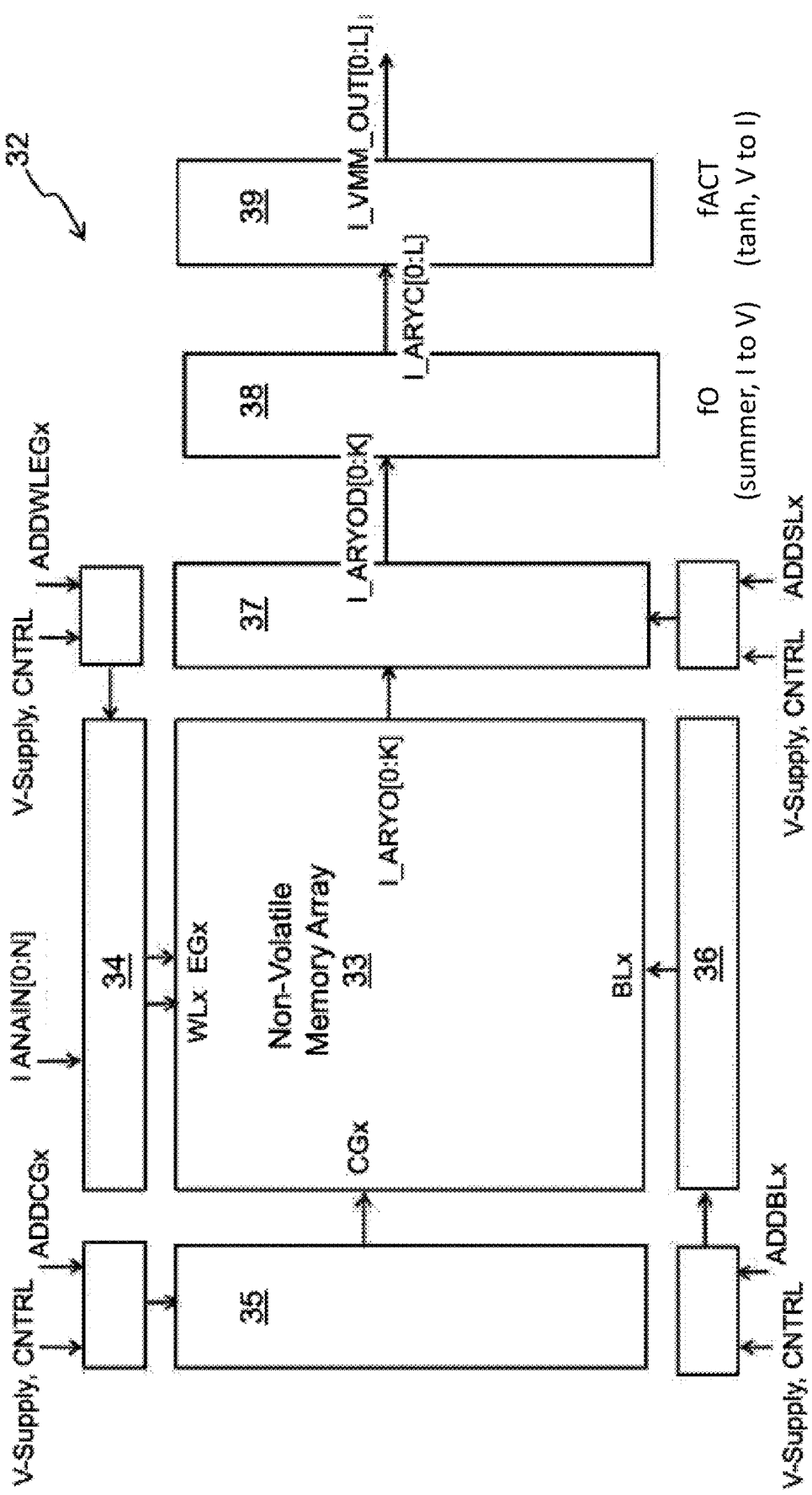
FIG. 10 depicts a VMM system comprising a VMM array and other circuitry.
Figure 11:
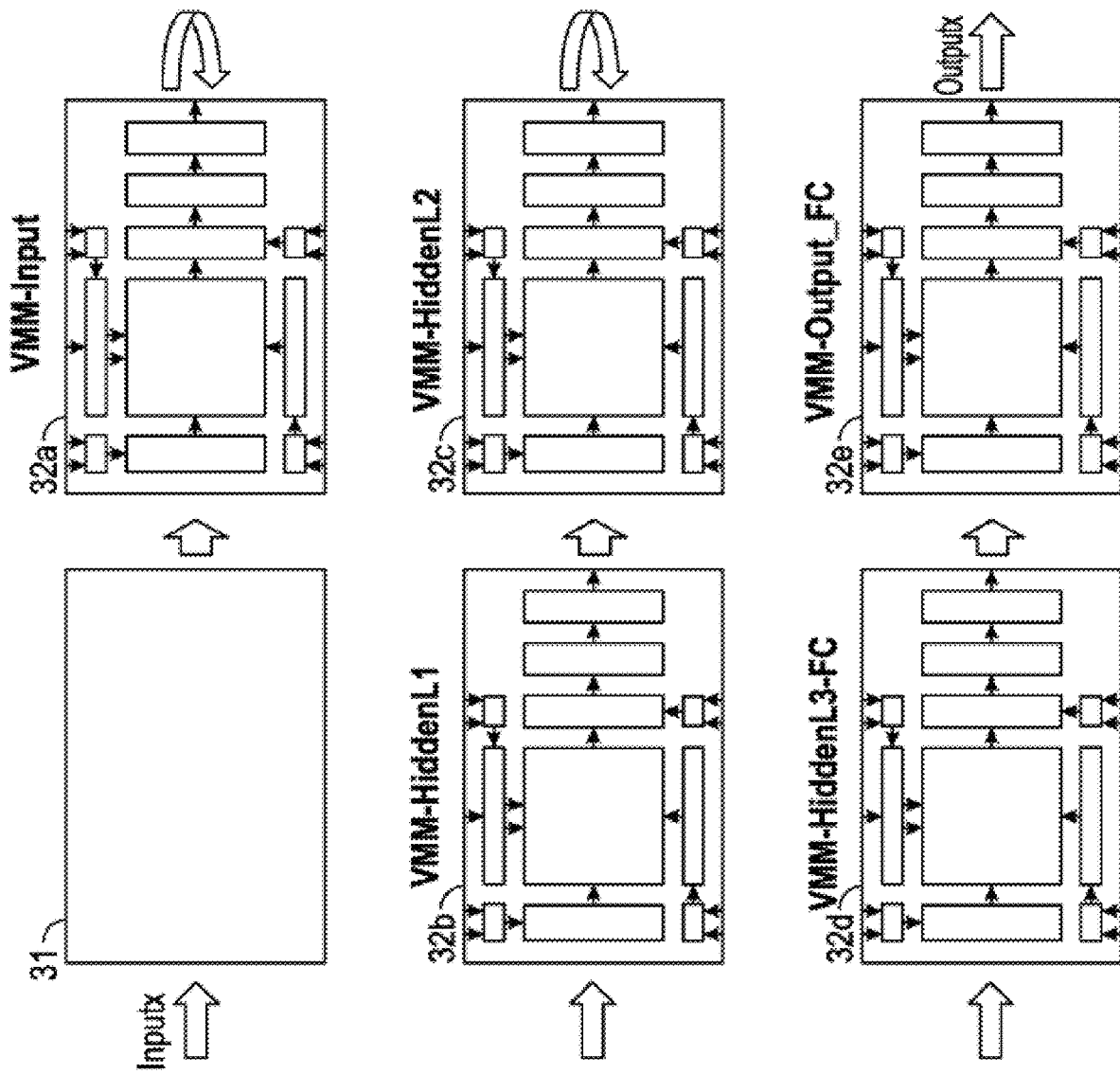
FIG. 11 depicts an exemplary artificial neural network utilizing one or more VMM systems.
Figure 12:
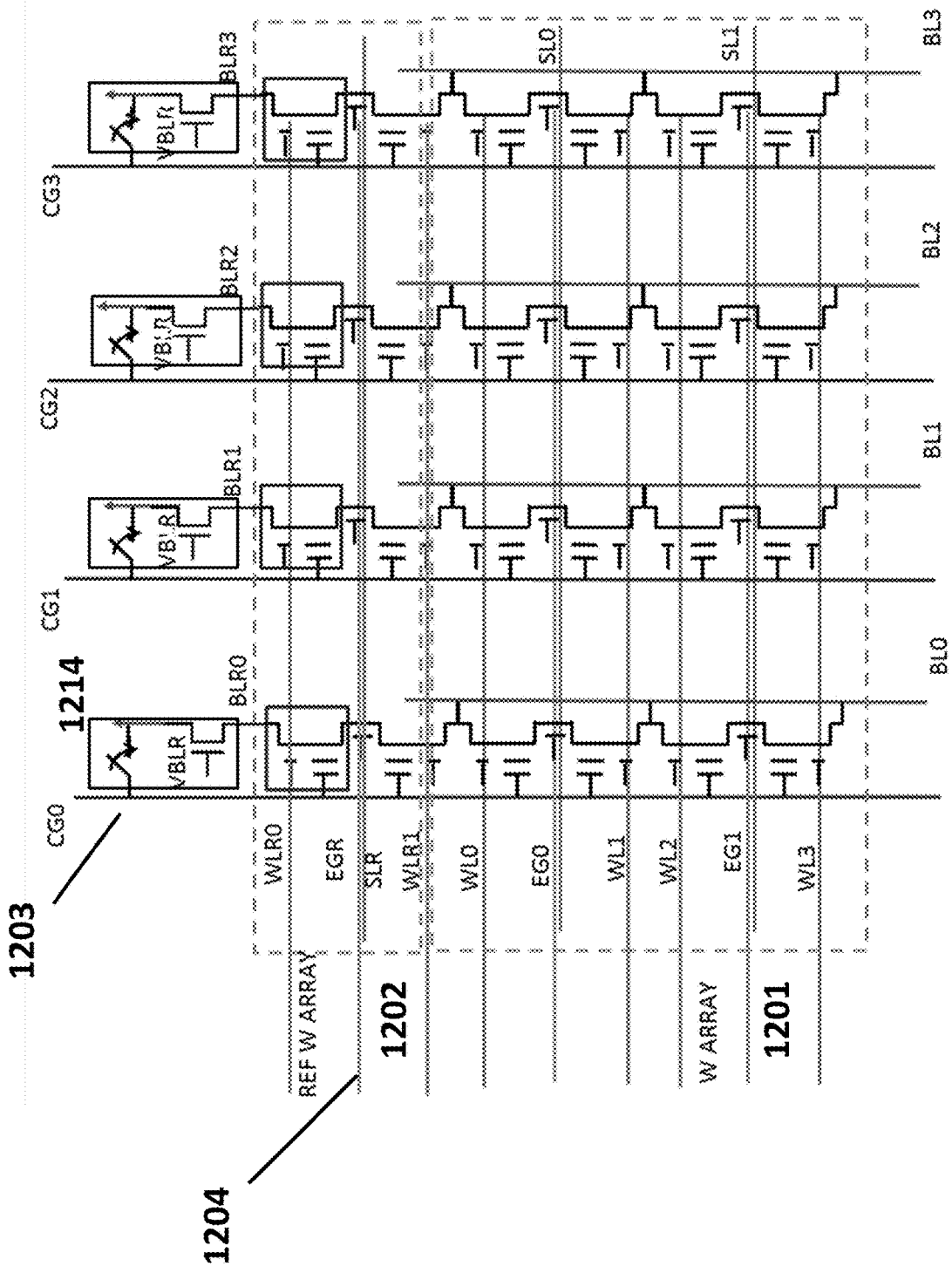
FIG. 12 depicts an example of a VMM array.
Figure 13:
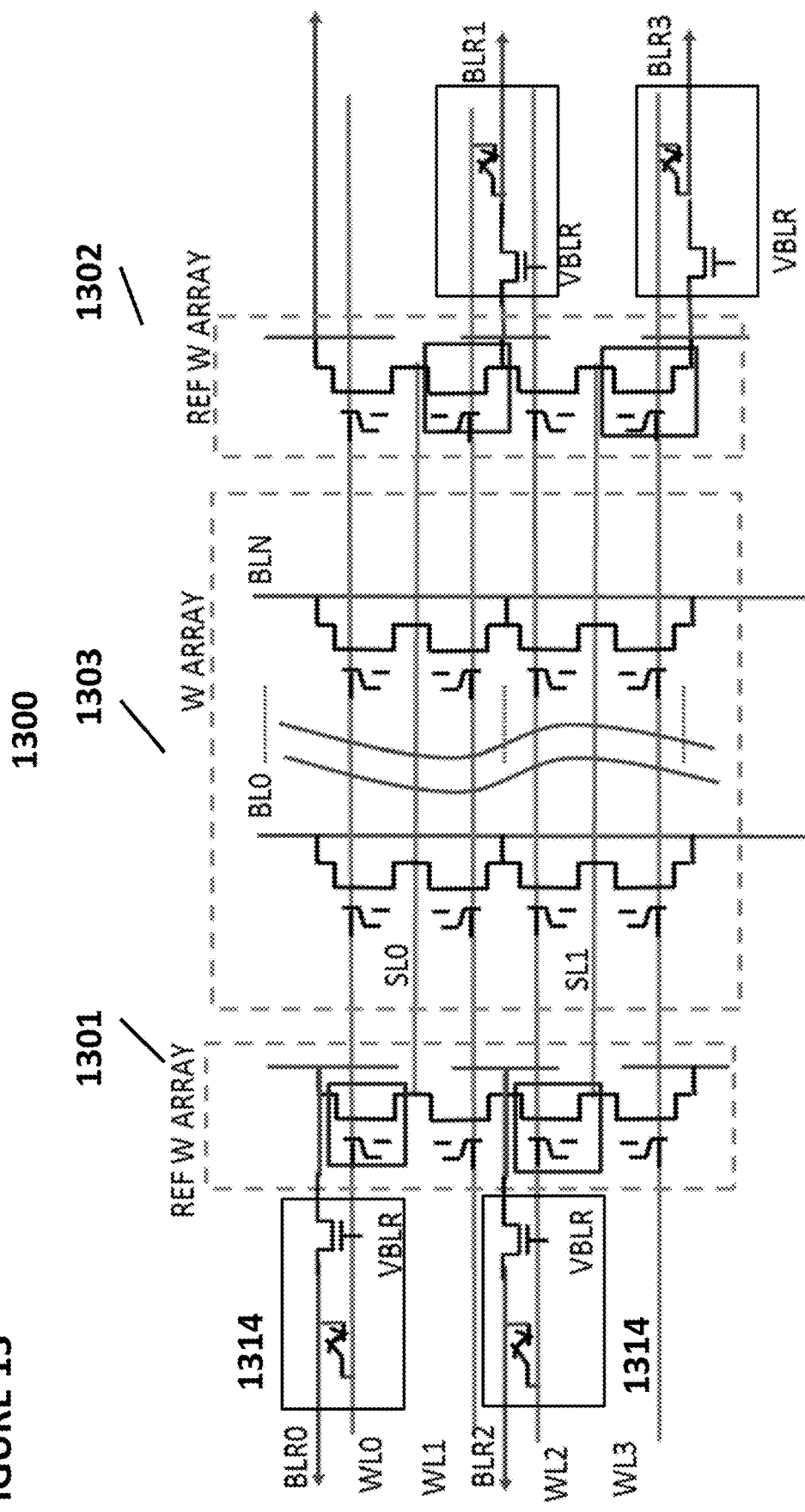
FIG. 13 depicts another example of a VMM array.
Figure 14:
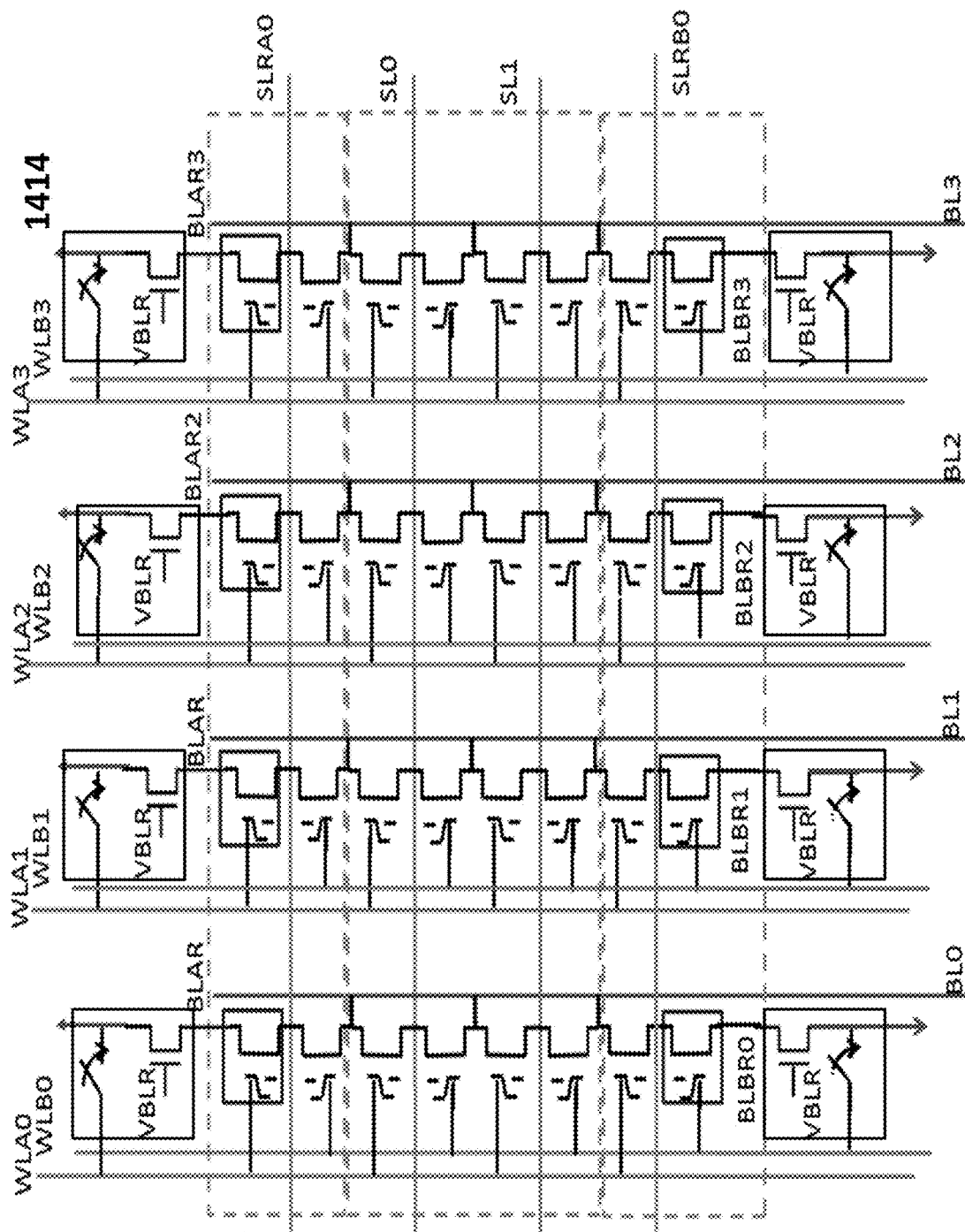
FIG. 14 depicts another example of a VMM array.
Figure 15:
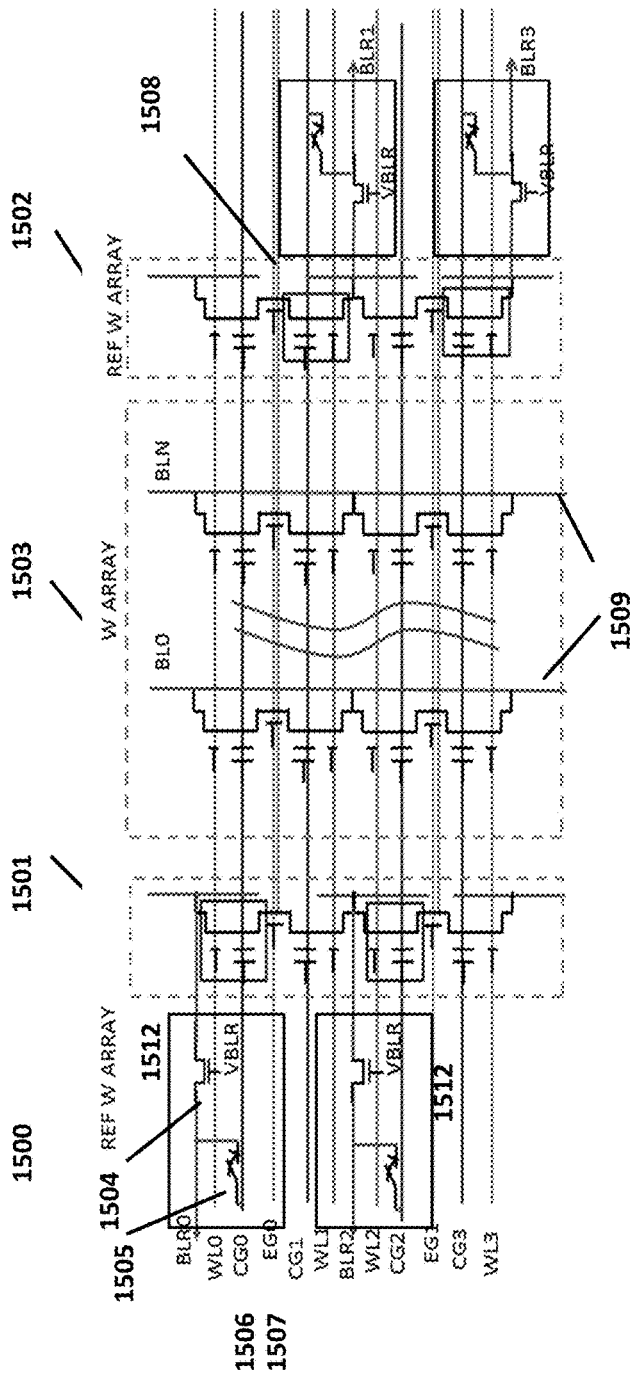
FIG. 15 depicts another example of a VMM array.
Figure 16:
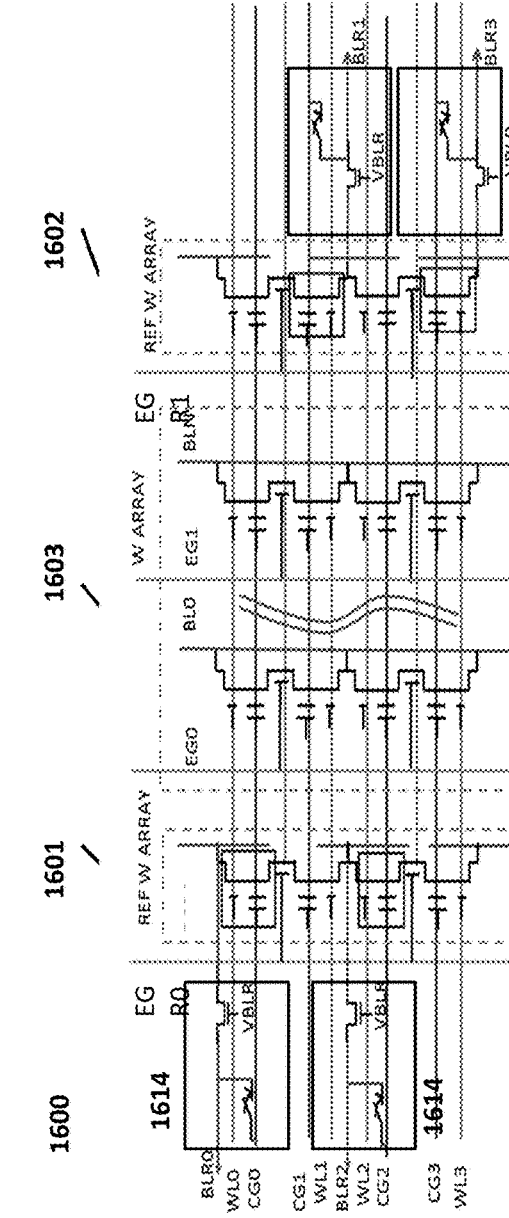
FIG. 16 depicts another example of a VMM array.
Figure 17:
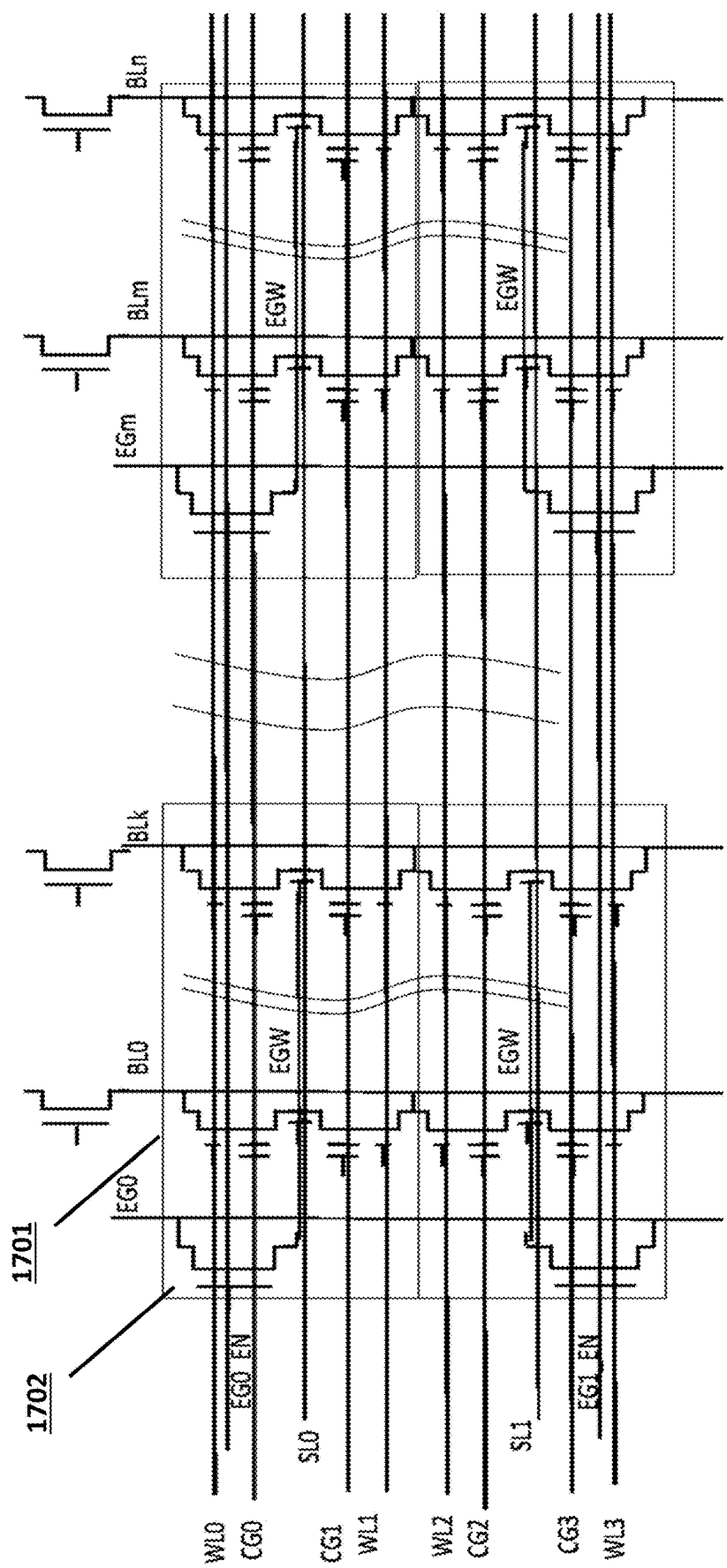
FIG. 17 depicts an example of a VMM array with erase capability on a page basis.

FIG. 17 depicts VMM array 1700. VMM array 1700 implements bi-directional tuning for a page of non-volatile memory cells. Here, exemplary page 1701 comprises two words, each in a different row. A word includes a plurality of memory cells, e.g. 8-64. A special word may include just one cell or a few cells. Pairs of adjacent rows share a source line, such as SL0 or SL1. All cells in page 1701 share a common erase gate line that is controlled by erase gate enable transistor 1702, which controls the provision of a voltage to the erase gate terminals EGW of all cells in exemplary page set 1701. Here, all cells in page 1701 can be erased at the same time. Thereafter, cells in page 1701 can be bi-directionally tuned through program and erase operations and some cells in page 1701 can be uni-directionally tuned through program operation. The program operations can include the precision programming techniques described below with reference to FIGS. 20 and 21. If too much electron charge is placed on a floating gate (which would cause an incorrect current value to be stored in the cell, i.e. a current value lower than the intended current value), the cell must be erased and the sequence of partial programming operations must start over.

Figure 18:
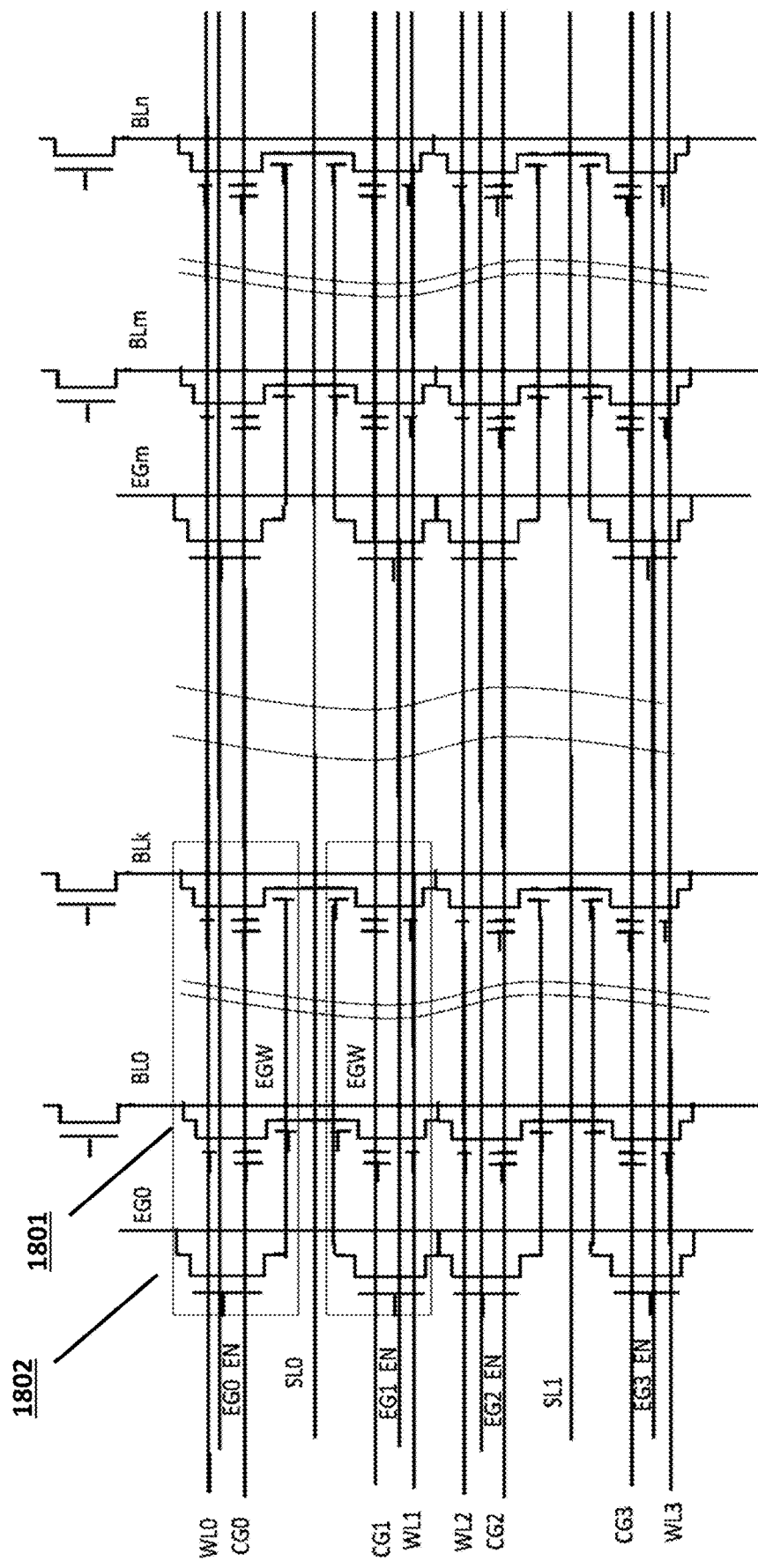
FIG. 18 depicts an example of a VMM array with erase capability on a word basis.

FIG. 18 depicts VMM array 1800. VMM array 1800 implements bi-directional tuning for a word of non-volatile memory cells. Here, exemplary word 1801 comprises a plurality of cells in a row. All cells in word 1801 share a common erase gate line that is controlled by erase gate enable transistor 1802, which controls the provision of a voltage to the erase gate terminals of all cells in word 1801. Here, all cells in word 1801 can be erased at the same time. Thereafter, cells in word 1801 can be bi-directionally tuned through program and erase operations. The program operations can include the precision programming techniques described below. If too much electron charge is placed on a floating gate (such that an incorrect current value is stored in the cell, i.e. a current value lower than the intended current value), the cell must be erased and the sequence of partial programming operations must start over.

Figure 19:
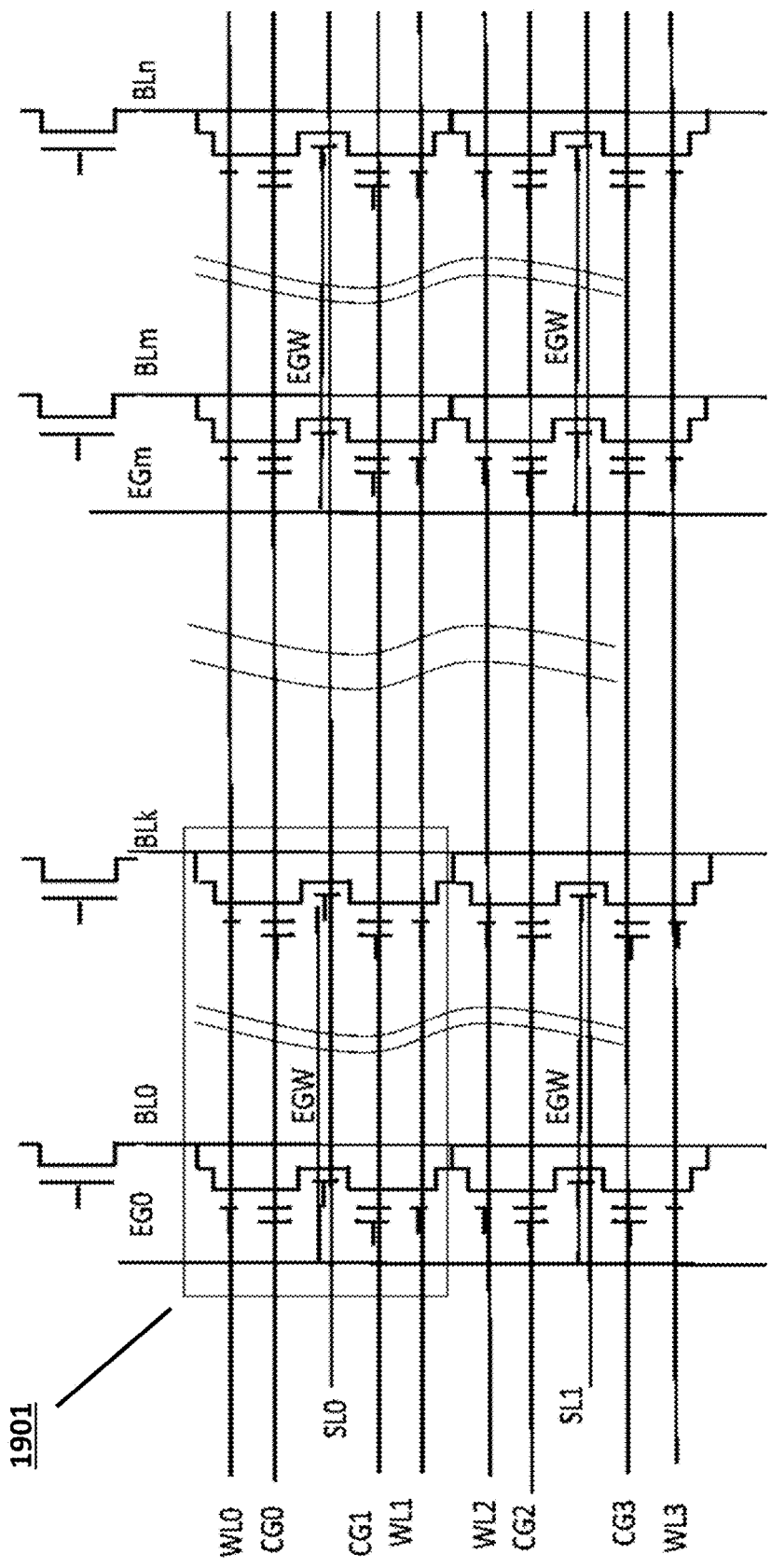
FIG. 19 depicts another example of a VMM array with erase capability on a word basis.

FIG. 19 depicts VMM array 1900. VMM array 1900 implements bi-directional tuning for a word of non-volatile memory cells. Here, exemplary word 1901 comprises two half words of cells. Each half word belongs to a row that shares an erase gate. All cells in word 1901 share a common erase gate line connected to erase gate terminal EGW. Unlike in VMM array 1800 and 1700, there is no erase gate enable transistor. Here, all cells in word 1901 can be erased at the same time. Thereafter, cells in word 1901 can be bi-directionally tuned through program and erase operations. The program operations can include the precision programming techniques described below. If too much electron charge is placed on a floating gate (such that an incorrect current value is stored in the cell, i.e. a current value lower than the intended current value), the cell must be erased and the sequence of partial programming operations must start over.

Although not shown in FIGS. 17, 18, and 19, source line pulldown bitlines, tuning bitlines (used for ultra fine programming), dummy bitlines, and redundant bitlines can be used, as described in U.S. Provisional Patent Application No. 62/981,757 filed on Feb. 26, 2020, and titled, "Ultra-Precise Tuning of Analog Neural Memory Cells In A Deep Learning Artificial Neural Network," which is incorporated by reference herein.

Figure 20A:
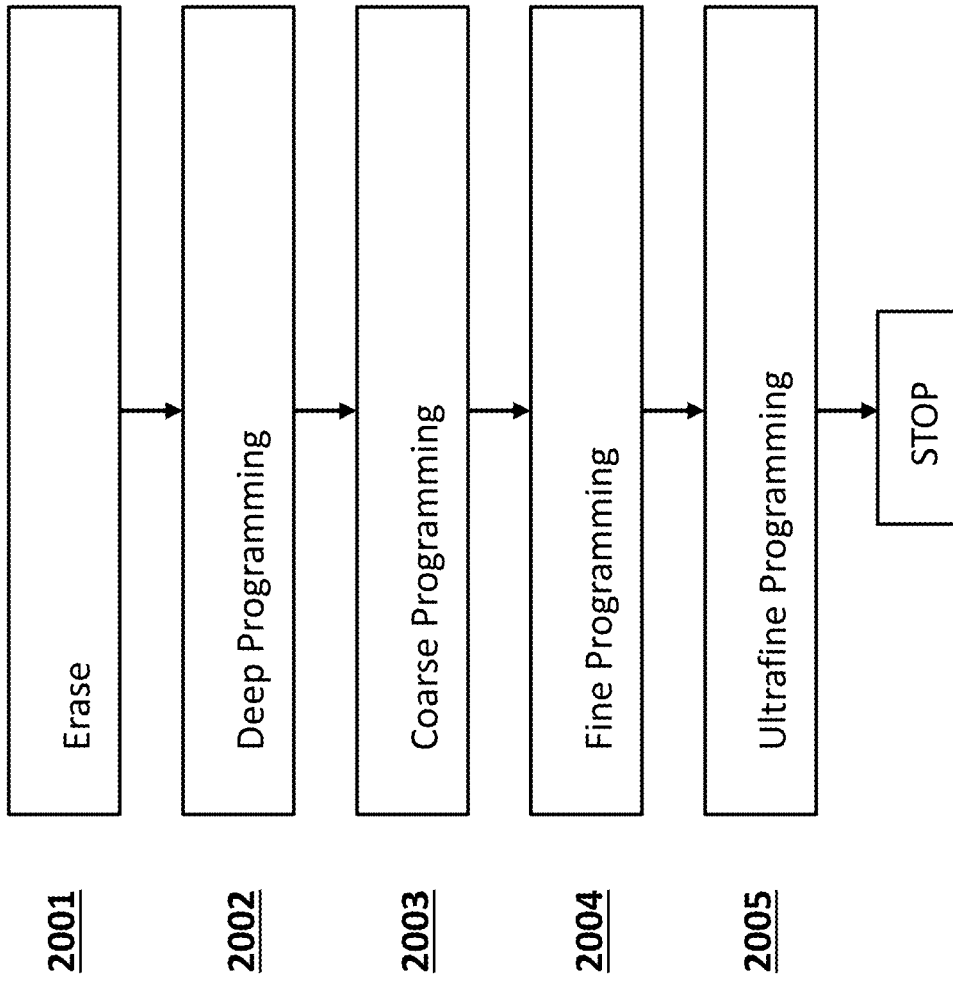
FIGS. 20A-20B depict a bi-directional tuning algorithm on a page or word basis.

FIG. 20A depicts tuning page/word algorithm 2000, which can be applied to VMM arrays 1700, 1800, or 1900 in FIGS. 17-19.

First, the word or page is erased (step 2001). Second, deep programming is performed on the un-used cells (step 2002). Deep programming is used to program the cells into a state (or target level) that has insignificant cell current during a read operation, for example <pA range. Third, coarse programming is performed on the cells within the word or page (step 2003). Coarse programming is used to program the cells into a coarse target level, for example within 50-500% of the target with large (coarse) increment voltage and/or program current and/or program timing. Fourth, fine programming is performed on the cells within the word or page (step 2004). Fine programming is used to program the cells into a fine target level, for example within +/−5-30% of the target with small (fine) increment program voltage and/or program current and/or program timing. Fifth, ultrafine programming optionally is performed on the cells within the word or page (step 2005). Ultrafine programming is used to program the cells into final target level with precise very small increment voltage and/or program current and/or program timing. The percentage achieved within the final target level in coarse/fine/ultrafine programming is traded off versus the magnitude of the increment level and/or program timing to minimize noise such as from program quantization noise (increment magnitude), disturb noise, various coupling noise, FG-FG coupling noise etc.

Figure 20B:
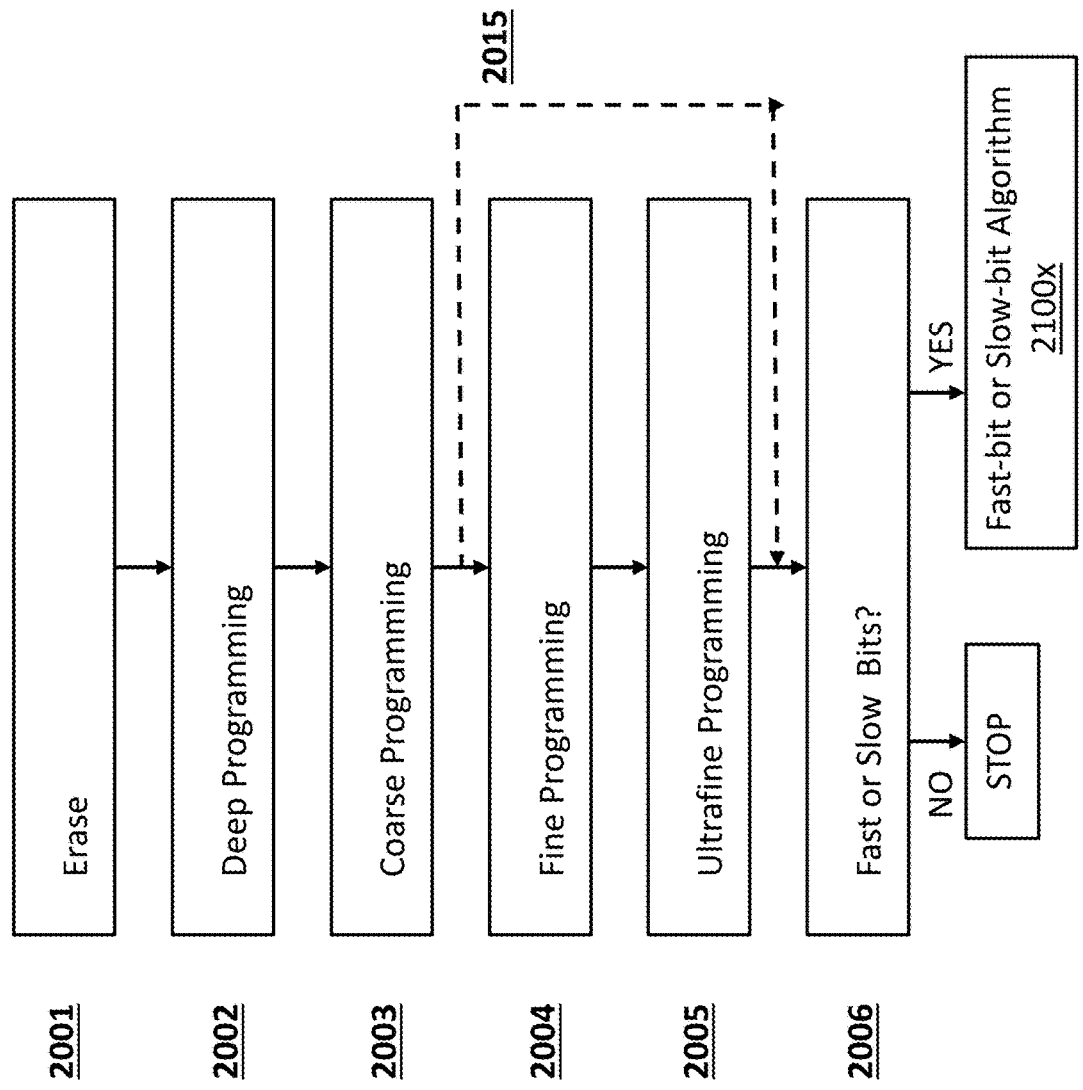

FIG. 20B depicts tuning page/word algorithm 2050, which can be applied to VMM arrays 1700, 1800, or 1900 in FIGS. 17-19. Tuning page/word algorithm 2050 is similar to tuning/page word algorithm 2000 in FIG. 20A, except that tuning page/word algorithm 2050 further includes steps for handling fast or slow bits. Steps 2001-2005 occur as in FIG. 20A. In step 2006 or alternatively in step 2003, a determination is made whether the word or page contains any fast-bits or slow-bits (step 2006). A fast bit is a bit that requires a shorter period of programming to reach a desired level than a normal bit, and a slow bit is a bit that requires a longer period of programming to reach a desired level than a normal bit. The fast bit can be detected by monitoring the program rate (program speed) of the cells such by my measuring delta Ir/delta tprog (current change over time, for example current change over K consecutive pulses)>a pre-determined R factor, for example K=2 pulses. The slow bit can be detected by monitoring the program rate delta Ir/delta tprog<a pre-determined R factor. If no, then the algorithm stops. If yes, then the fast-bit or slow-bit cells are identified and flagged. Thereafter, any programming of that word or page will utilize fastbit or slowbit algorithms, as discussed below with reference to FIGS. 21A and 21B.

Applicant previously disclosed various techniques for performing coarse programming, fine programming, and ultrafine programming in U.S. Provisional Patent Application No. 62/981,757, filed on Feb. 26, 2020, and titled, "Ultra-Precise Tuning of Analog Neural Memory Cells in a Deep Learning Artificial Neural Network," which is incorporated by reference herein.

Figure 21A:
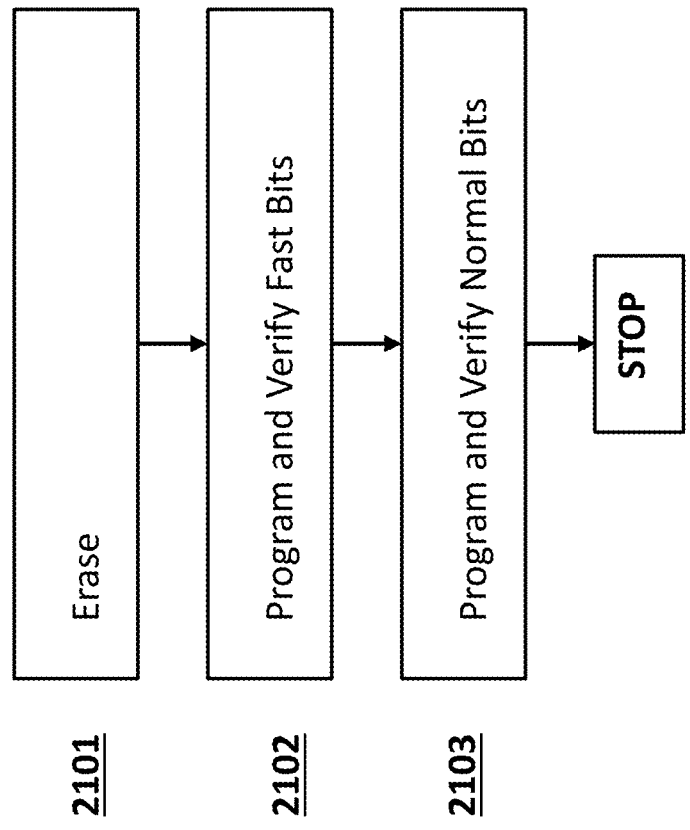
FIG. 21A depicts a fast-bit algorithm.
Figure 21B:
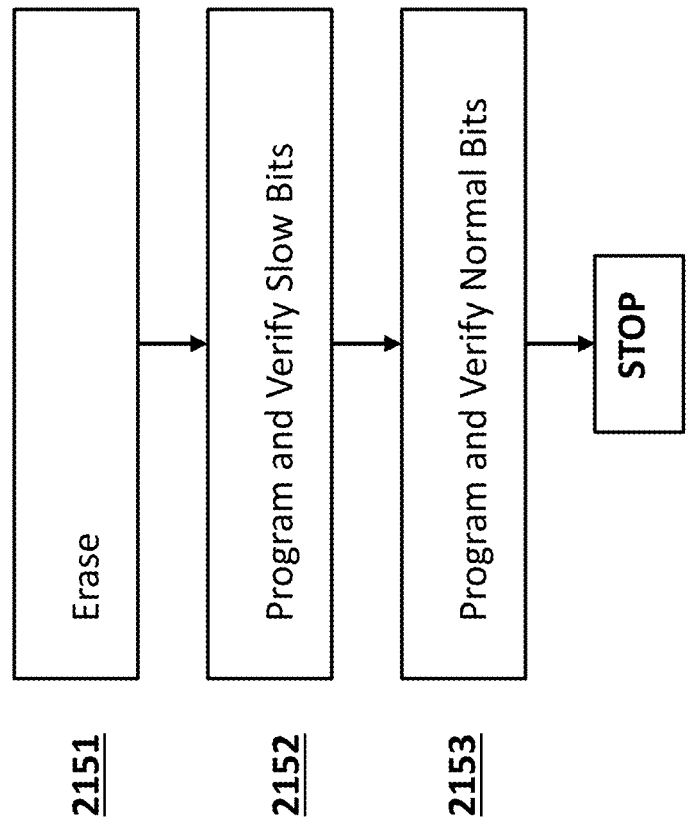
FIG. 21B depicts a slow-bit algorithm.

FIG. 21A depicts fast-bit algorithm 2100. This is performed if a word or page has been determined to contain one or more fast-bit cells, also known as fast-bits. First, the word or page is erased or partially erased (step 2101). Second, the fast-bits are programmed and verified (step 2102). This is for example done with smaller than the default (or constant) voltage increment and/or smaller than the default program current and/or smaller than the default timing. Next the normal bits, i.e. all bits not flagged as fast-bits or slow-bits, are programmed and verified (step 2103). This is for example done with default setting of coarse/fine/ultrafine voltage increment and/or program current and/or timing FIG. 21B depicts slowbit algorithm 2150. This is performed if a word or page has been determined to contain one or more slow-bit cells. First, the word or page is erased or partially erase (step 2151). Second, the slow-bit cells are programmed and verified (step 2152). This is for example done with larger than the default voltage increment and/or larger than the default program current and/or larger than the default timing. Next the normal bits, i.e. all bits not flagged as slow-bits or fast-bits, are programmed and verified (step 2153). This is for example done with default setting of coarse/fine/ultrafine voltage increment and/or program current and/or timing In one example, the slow-bit cells are tuned first to avoid disturb to other cells in the same page/word, then fast-bit cells are tuned, and then normal-bit cells are tuned.

In one example, the slow-bit cells are tuned first (to avoid disturb to other cells in the same page/word), then normal-bit cells are tuned, and then fast-bit cells are tuned.

Figure 22:
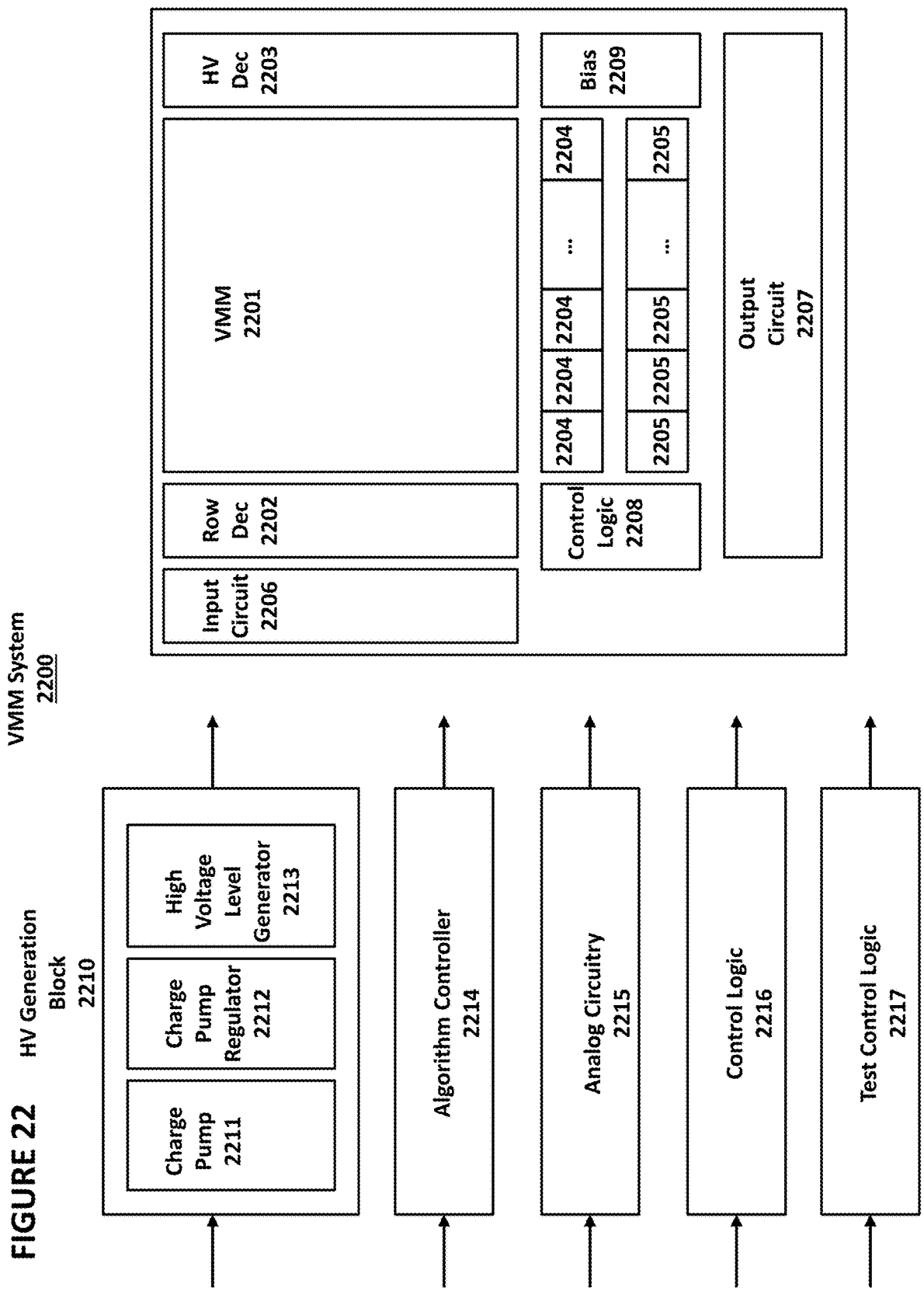
FIG. 22 depicts a VMM system.

FIG. 22 depicts a block diagram of VMM system 2200. VMM system 2200 comprises VMM array 2201, row decoders 2202, high voltage decoders 2203, column decoders 2204, bit line drivers 2205, input circuit 2206, output circuit 2207, control logic 2208, and bias generator 2209. VMM system 2200 further comprises high voltage generation block 2210, which comprises charge pump 2211, charge pump regulator 2212, and high voltage level generator 2213. VMM system 2200 further comprises (program/erase, or aka weight tuning) algorithm controller 2214, analog circuitry 2215, control logic 2216, and test control logic 2217. The systems and methods described below can be implemented in VMM system 2200.

The input circuit 2206 may include circuits such as a DAC (digital to analog converter), DPC (digital to pulses converter), AAC (analog to analog converter, such as a current to voltage converter), PAC (pulse to analog level converter), or any other type of converters. The input circuit 2206 may implement normalization, linear or non-linear up/down scaling functions, or arithmetic functions. The input circuit 2206 may implement a temperature compensation function for input. The input circuit 2206 may implement an activation function such as ReLU or sigmoid. The output circuit 2207 may include circuits such as a ADC (analog to digital converter, to convert neuron analog output to digital bits), AAC (analog to analog converter, such as a current to voltage converter), APC (analog to pulse(s) converter), or any other type of converters. The output circuit 2207 may implement an activation function such as ReLU or sigmoids. The output circuit 2207 may implement statistic normalization, regularization, up/down scaling functions, statistical rounding, or arithmetic functions (e.g., add, subtract, divide, multiply, shift, log) for neuron outputs. The output circuit 2207 may implement a temperature compensation function for neuron outputs or array outputs (such as bitline output) so as to keep power consumption of the array approximately constant or to improve precision of the array (neuron) outputs such as by keeping the IV slope approximately the same.

Figure 23:
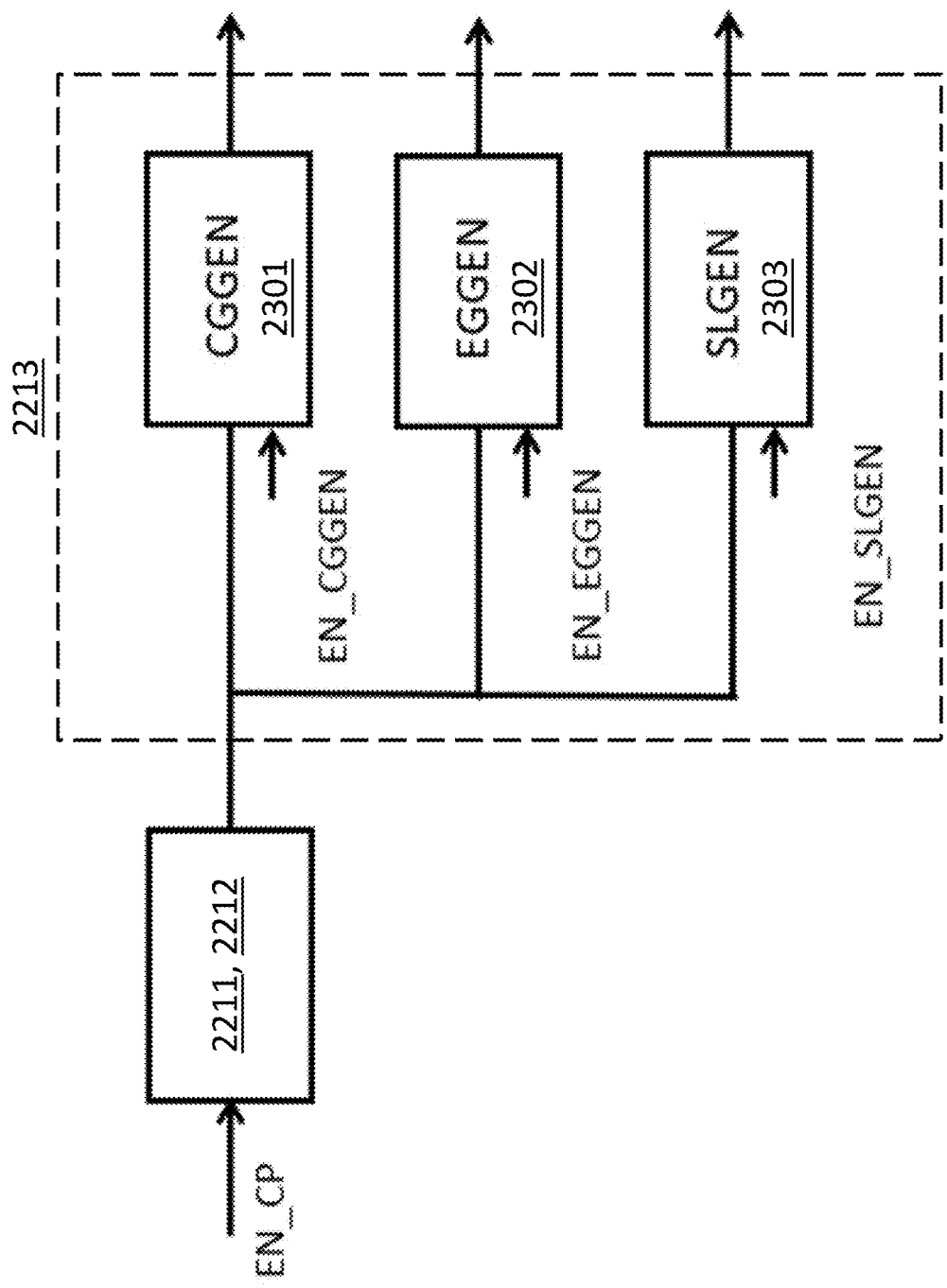
FIG. 23 depicts a high voltage generation block.

FIG. 23 depicts high voltage generation block 2300, which is an example of high voltage generation block 2210 from FIG. 22. High voltage generation block 2300 comprises charge pump 2211 and charge pump regulator 2212, which generate a variety of high voltages and are controlled by an enable signal here labeled as EN_CP. Charge pump 2211 and charge pump regulator 2212 provide the requisite high voltages to control gate high voltage generator 2301, erase gate high voltage generator 2302, and source line high voltage generator 2303, which are controlled by enable signals labeled EN_CGGEN, EN_EGGEN, and EN_SLGEN, respectively, and which provide high voltage signals to control gate lines, erase gate lines, and source lines, respectively, as needed during program, erase, or read operations within a VMM array.

Figure 24:
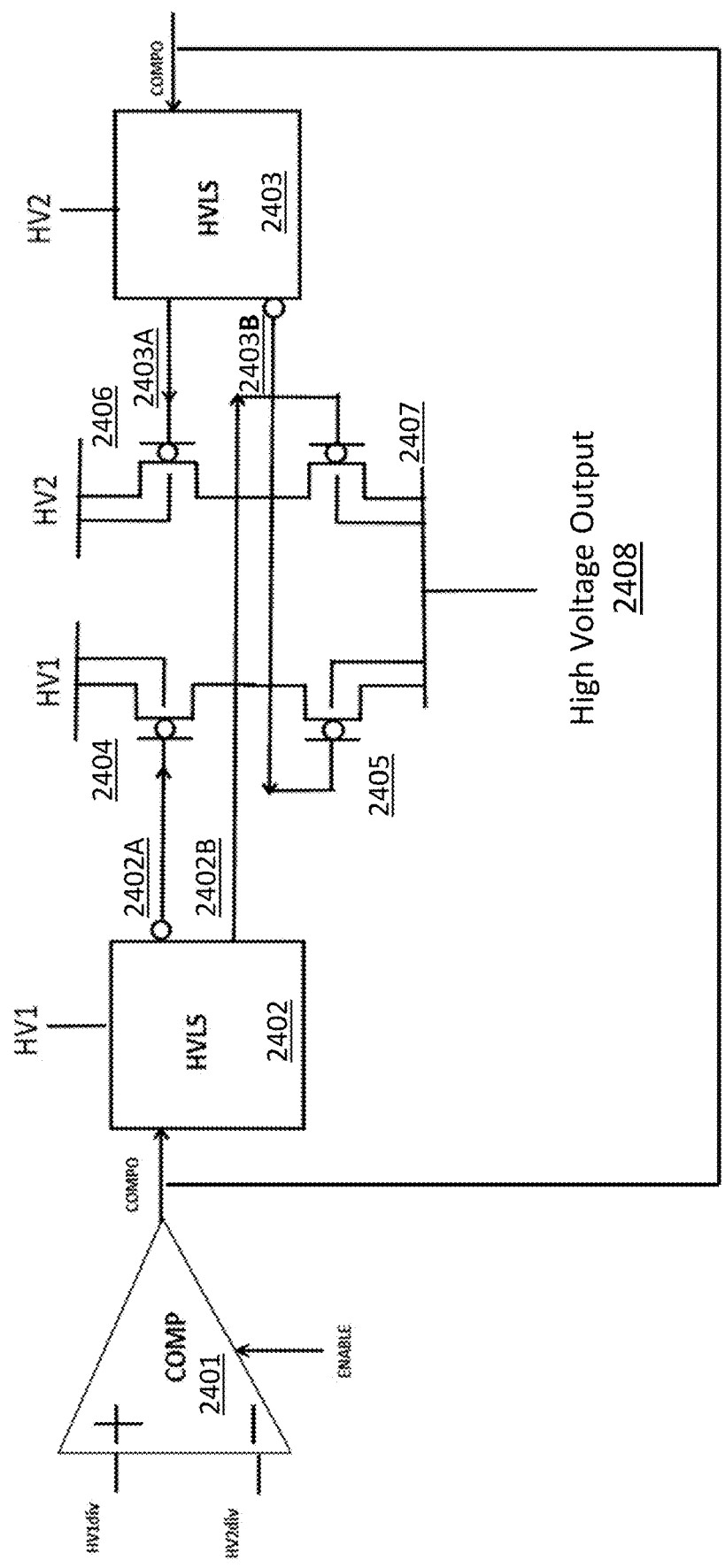
FIG. 24 depicts a high voltage maximum circuit.

FIG. 24 depicts a high voltage maximum circuit, used to supply the high voltage power supply, which identifies the voltage that is highest between a first high voltage HV1 and a second high voltage HV2 and outputs the highest voltage. Comparator 2401 receives HV1div and HV2div, which are level-shifted, divided down (i.e. low voltage) versions of HV1 and HV2, respectively. Comparator 2401 outputs a high signal on line COMPO if HV1 is greater than HV2, and it outputs a low signal on line COMPO if HV1 is less than HV2. The output of comparator 2401 on line COMPO is provided to high voltage level shifter 2402 and high voltage level shifter 2403. If the output of comparator 2401 is low, then high voltage level shifter 2402 outputs a low signal on line 2402B and high voltage level shifter 2403 outputs a low signal on line 2403A. If the output of comparator 2401 is high, then high voltage level shifter 2402 outputs a low signal on line 2402A and high voltage level shifter 2403 outputs a low signal on the line 2403B. PMOS transistors 2404, 2405, 2406, and 2407 are configured as shown, i.e. with their gate coupled to a respective one of lines 2402A, 2402B, 2403A and 2403B. If high voltage level shifter 2402 outputs a low signal on the line 2402B and high voltage level shifter 2403 outputs a low signal on the line 2403A, then high voltage output 2408 will be equivalent to HV2, less any voltage drop across PMOS transistors 2406, 2407. If high voltage level shifter 2402 outputs a low signal on the line 2402A and high voltage level shifter 2403 outputs a low signal on the line 2403B, then high voltage output 2408 will be equivalent to HV1, less any voltage drop across PMOS transistors 2404, 2405.

Figure 25:
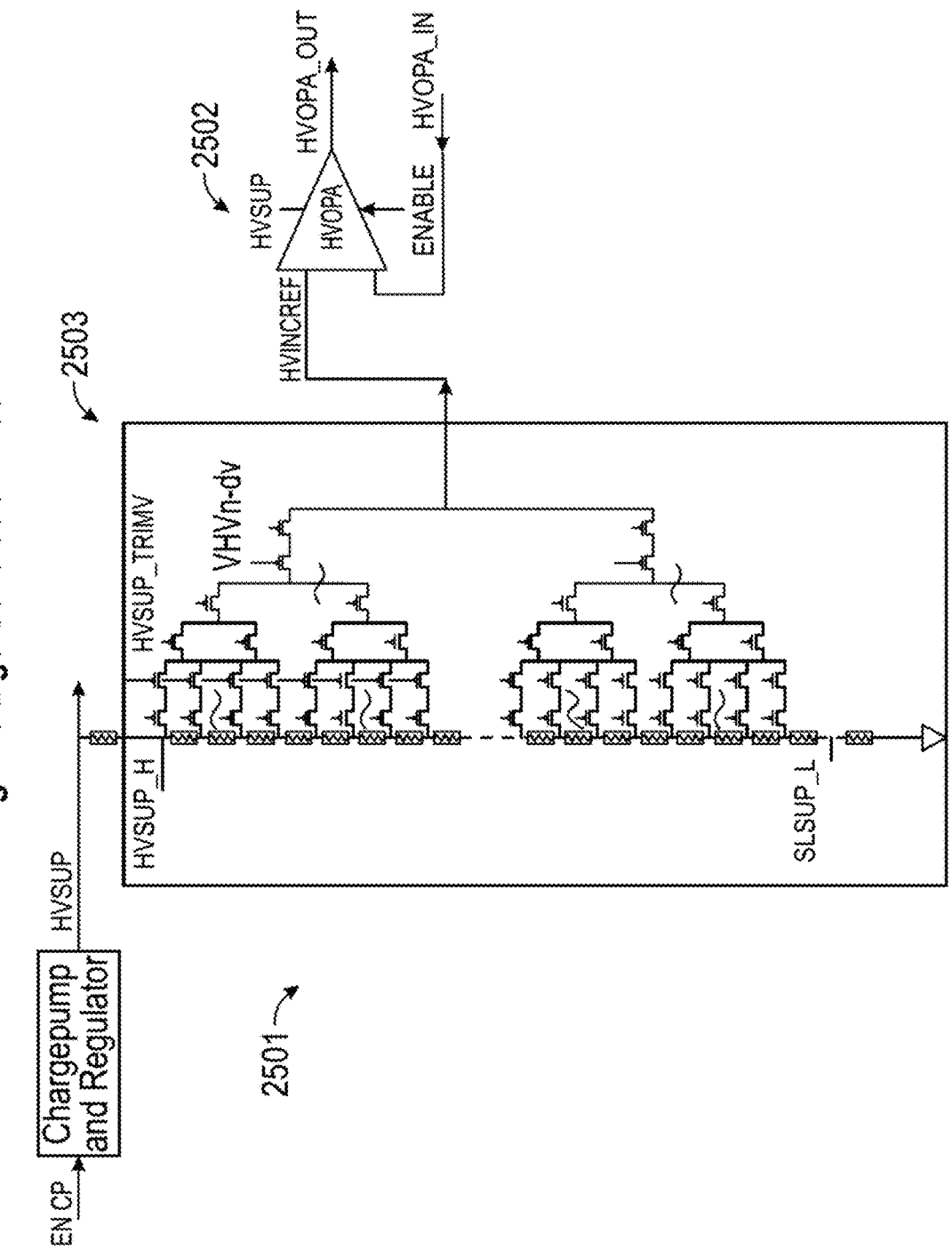
FIG. 25 depicts another high voltage generation block.

FIG. 25 depicts high voltage generation block 2500, which is another example of high voltage generation block 2412. Here, high voltage generation block 2500 comprises charge pump and regulator 2501 enabled by signal EN_CP, high voltage increment reference generator 2503, and high voltage buffer operational amplifier 2502. The voltage of the output of charge pump regulator 2503 can be controlled based on the signals sent to the gates of the MOS transistors in high voltage increment reference generator 2503, by trimming the portion of the output voltage HVSUP output by charge pump 2501 fed to the input of high voltage op-amp HVOPA.

Figure 26:
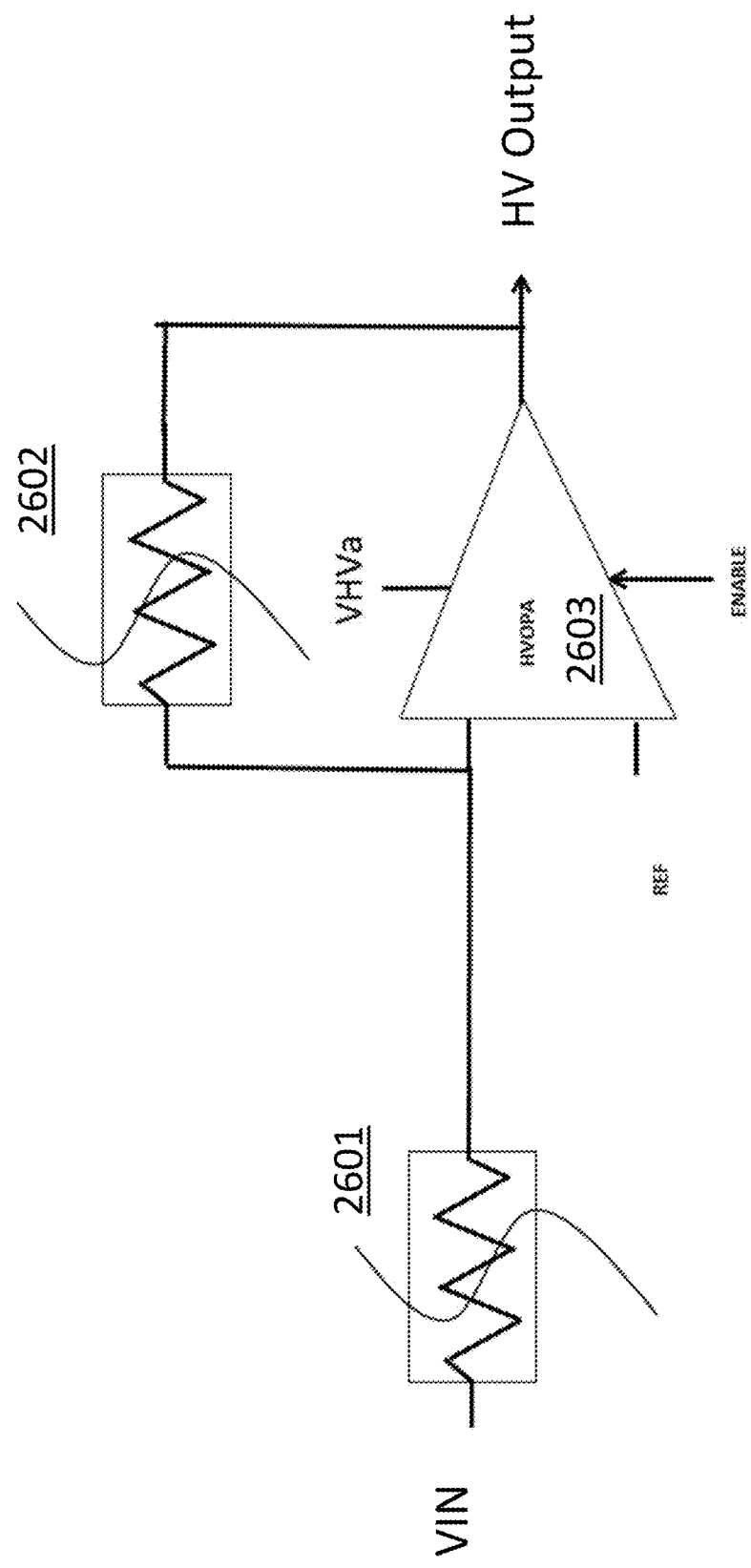
FIG. 26 depicts another high voltage generation block.

FIG. 26 depicts high voltage generator block 2600, which is another example of high voltage generation block 2412. High voltage generation block 2600 receives input VIN (a low voltage signal) and generates output HV Output (a high voltage signal), and comprises operational amplifier 2603, variable resistor 2601, and variable resistor 2602, where the gain (of operational amplifier 2601 is dependent on the values of variable resistor 2601 and/or variable resistor 2602. The high voltage increment value is hence controlled by the value of the variable resistor 2601 and/or resistor 2602.

Figure 27A:
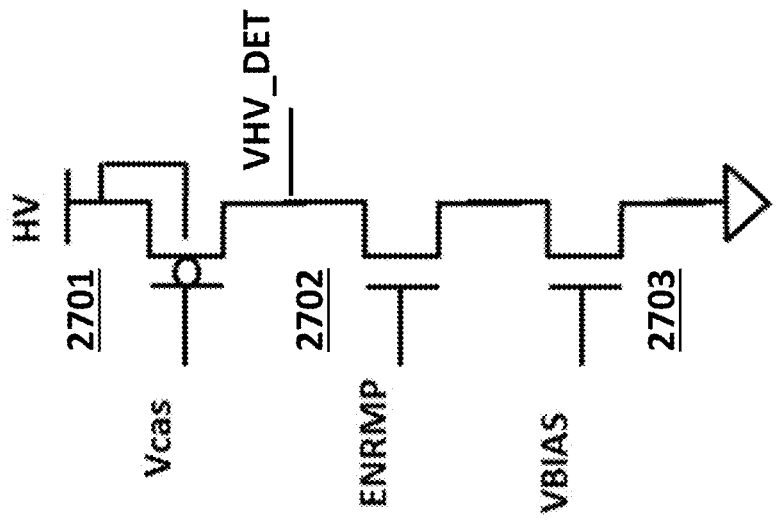
FIGS. 27A-27B depicts examples of a ramp down circuit.

FIG. 27A depicts ramp down control circuit 2700, which comprises clamp PMOS transistor 2701, enabling NMOS transistor 2702, and current bias NMOS transistor 2703, configured as shown. Ramp down circuit 2700 receives voltage HV to be ramped down at the source of PMOS transistor 2701 and generates output signal VHV DET at the drain of PMOS transistor 2701, which will have a peak value of HV and will ramp down toward ground in response to signal ENRMP, fed to the gate of enabling NMOS transistor 2702, changing from low to high. Output signal VHV_DET will be ramped down from HV value to Vcas+Vt PH value by a current controlled by the current bias NMOS transistor 2703 when ENRMP equals to high.

Figure 27B:
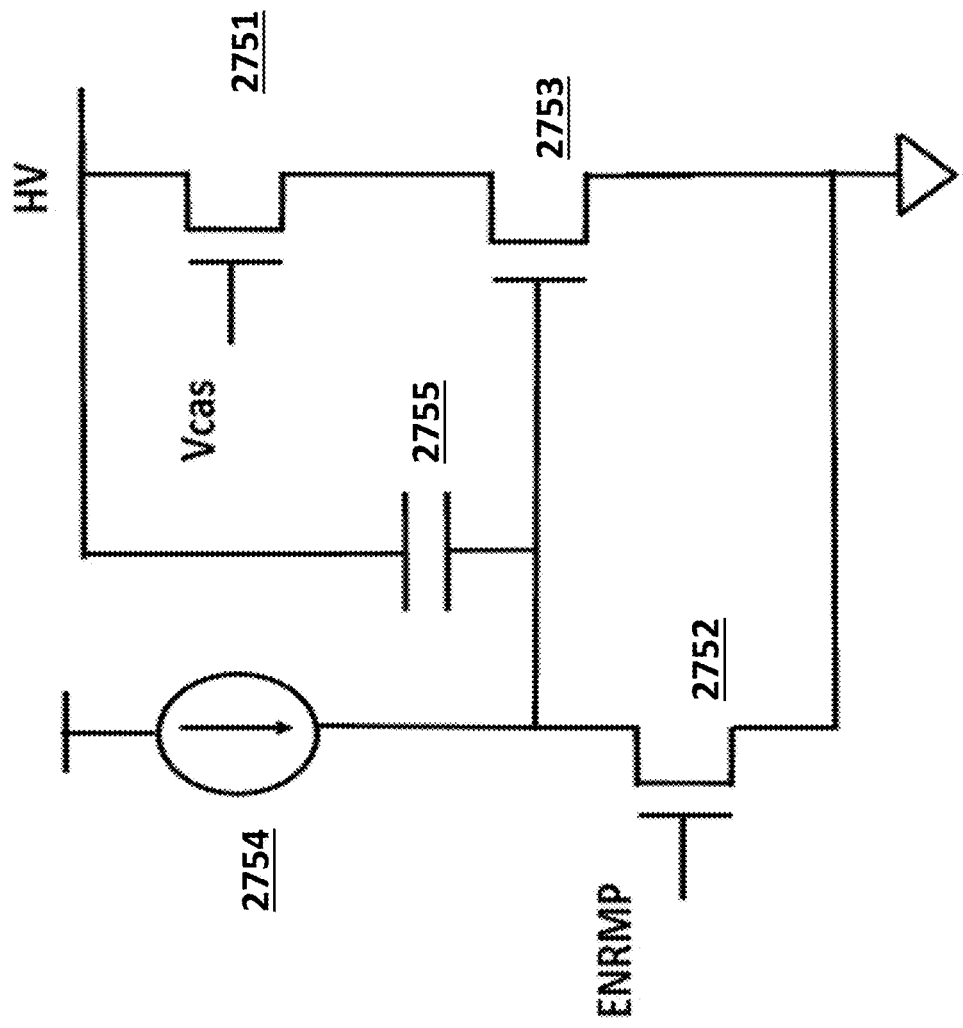

FIG. 27B shows another ramp down control circuit 2750, which comprises cascoding NMOS transistor 2751, shunt NMOS transistor 2753 (provide ramp current), enabling NMOS transistor 2572, current source 2754, and capacitor 2755. The HV node ramp down rate is controlled by I/C (=I or reference current source 2754/capacitance of capacitor 2755).

Figure 28:
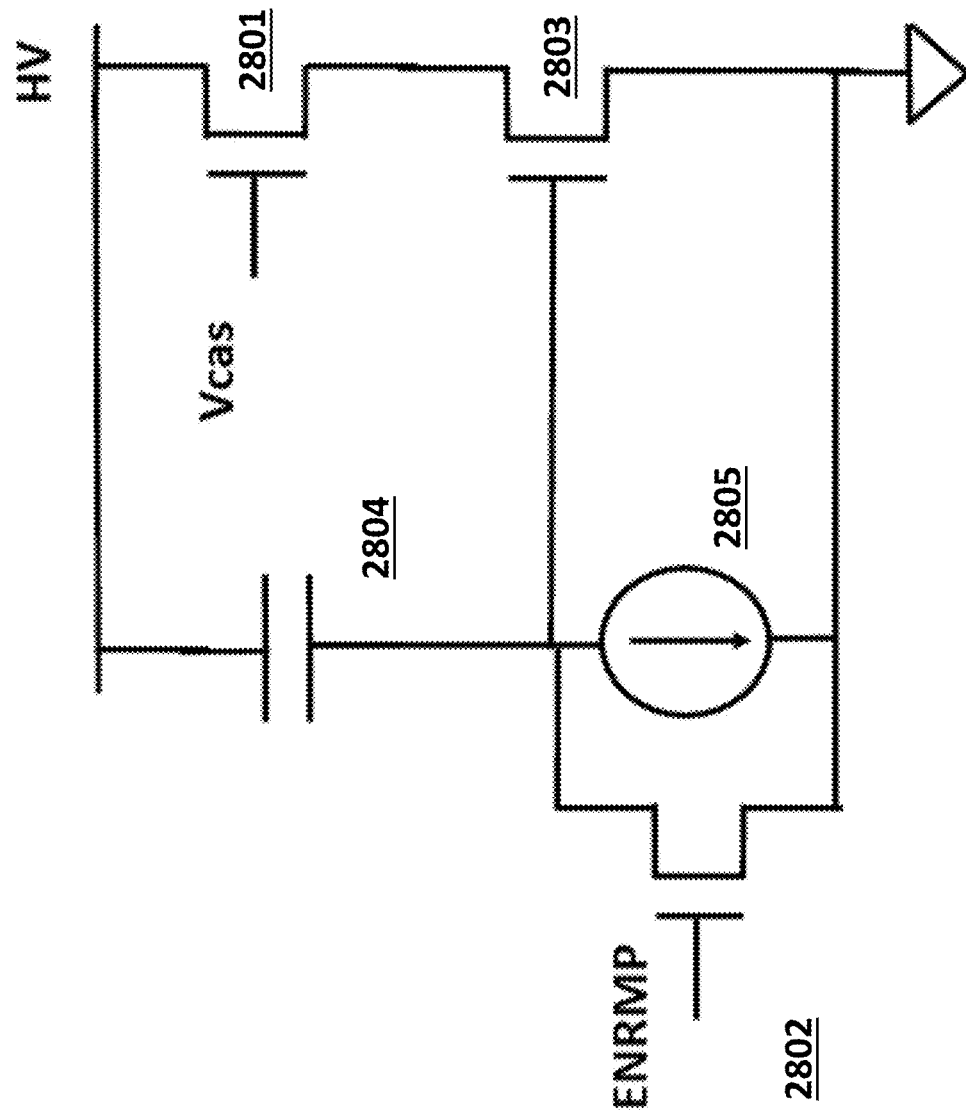
FIG. 28 depicts a ramp up circuit.

FIG. 28 depicts ramp up circuit 2800, which comprises NMOS cascoding transistor 2801, enabling NMOS transistor 2802, current shunt NMOS transistor 2803, current source 2805, and capacitor 2804, configured as shown. Ramp up circuit 2800 controls the ramping rate of the HV node by the ratio of I/C (=I reference current source 2805/capacitance of capacitor 2804) by shunting the current through the NMOS transistor 2803. The ramp rate on the HV node is such that the current injected through the capacitor 2804 is equal to the current source 2805.

FIGS. 29A, 29B, and 29C depict VMM high voltage decode circuits, comprising word line decoder circuit 2901, source line decoder circuit 2904, and high voltage level shifter 2908, which are appropriate for use with memory cells of the type shown in FIG. 2.

In FIG. 29A, word line decoder circuit 2901 comprises PMOS select transistor 2902 (controlled by signal HVO_B) and NMOS de-select transistor 2903 (controlled by signal HVO_B) configured as shown. HVSUP is high voltage supply such as supplied from a charge-pump and regulator. WLSUP provides voltage supply for wordline WL when HVO_B is enabled.

In FIG. 29B, source line decoder circuit 2904 comprises NMOS monitor transistors 2905 (controlled by signal HVO), driving transistor 2906 (controlled by signal HVO), and de-select transistor 2907 (controlled by signal HVO_B), configured as shown. When signal HVO is high, the voltage appearing on line SLSUP is passed through to line SL, and appears on monitoring line SL MON. When signal HVO_B is high, line SL is pulled down.

In FIG. 29C, high voltage level shifter 2908 receives enable signal EN and outputs high voltage signal HVO and its complement HVO_B between HVSUP, e.g., 12V, and HVSUP_LOW supply, e.g., 0V (when HVSUP is for example equal to an intermediate level ~5V) or 2.5V (when HVSUP is for example 12V). For example HVO can be 5V and HVO_B can be 0V, or HVO can be 12V and HVO_B can be 2.5V FIGS. 30A-30D depict VMM high voltage decode circuits, comprising erase gate decoder circuit 3001, control gate decoder circuit 3004, source line decoder circuit 3007, and high voltage level shifter 3011, which are appropriate for use with memory cells of the type shown in FIG. 3.

In FIGS. 30A and 30B, erase gate decoder circuit 3001 and control gate decoder circuit 3004 use the same design as word line decoder circuit 2901 in FIG. 29A.

In FIG. 30C, source line decoder circuit 3007 uses the same design as source line decoder circuit 2904 in FIG. 29.

In FIG. 30D, high voltage level shifter 3011 uses the same design as high voltage level shifter 2908 in FIG. 29.

FIGS. 31-34 depict programming sequences of voltages applied to a control gate terminal, source line terminal, and erase gate terminal of one or more non-volatile memory cells during a program operation.

Figure 31:
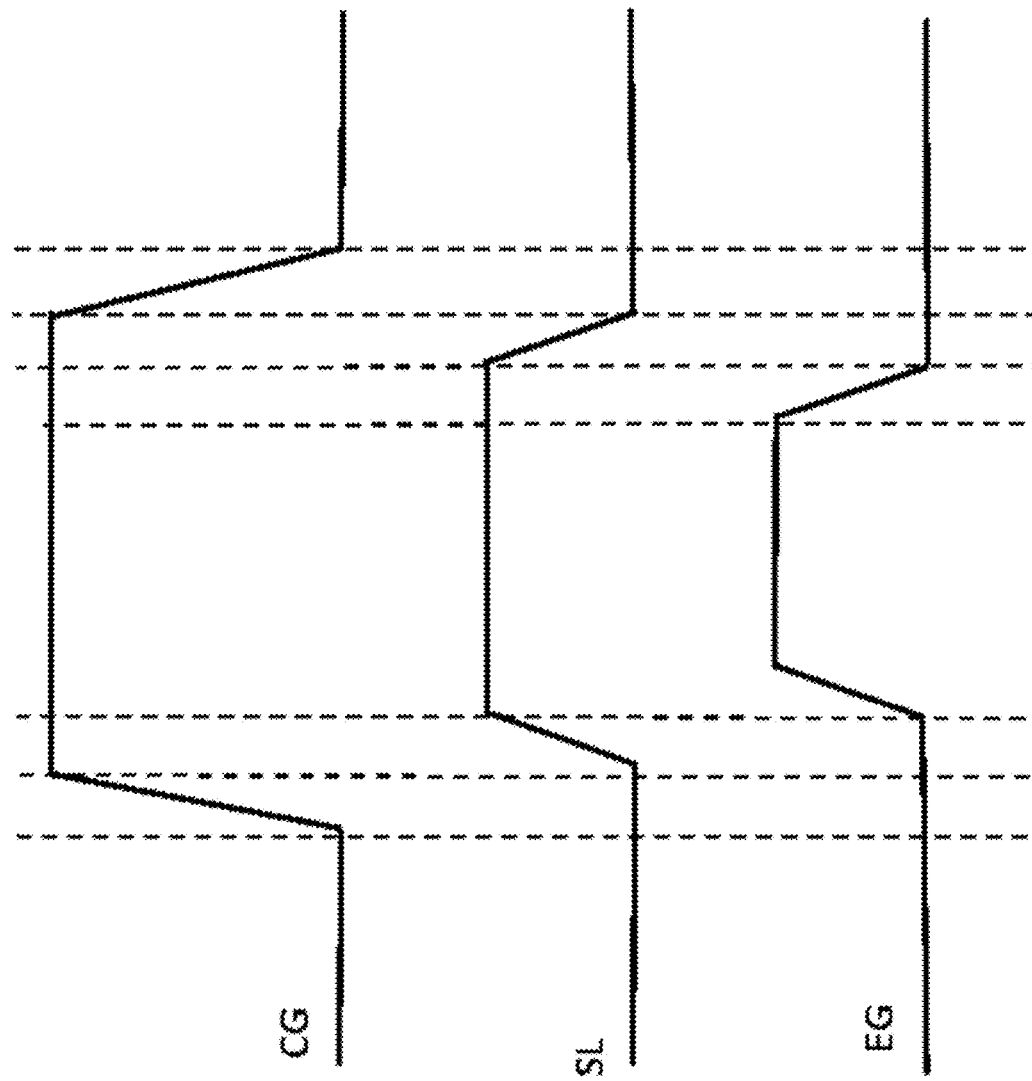
FIG. 31 depicts a program sequence.

FIG. 31 depicts program sequence 3100, where the control gate voltage CG ramps up during a first period, then the source line voltage SL ramps up during a second period, and then the erase gate voltage EG ramps up during a third period. All three voltages plateau at their peak values during a fourth period, and then the ramping sequence is reversed, erase gate voltage EG ramps down during a fifth period, source line voltage SL ramps down during a sixth period, and control gate voltage CG ramps down during a seventh period. Program sequence 3100 minimizes erase gate disturb occurrences.

Figure 32:
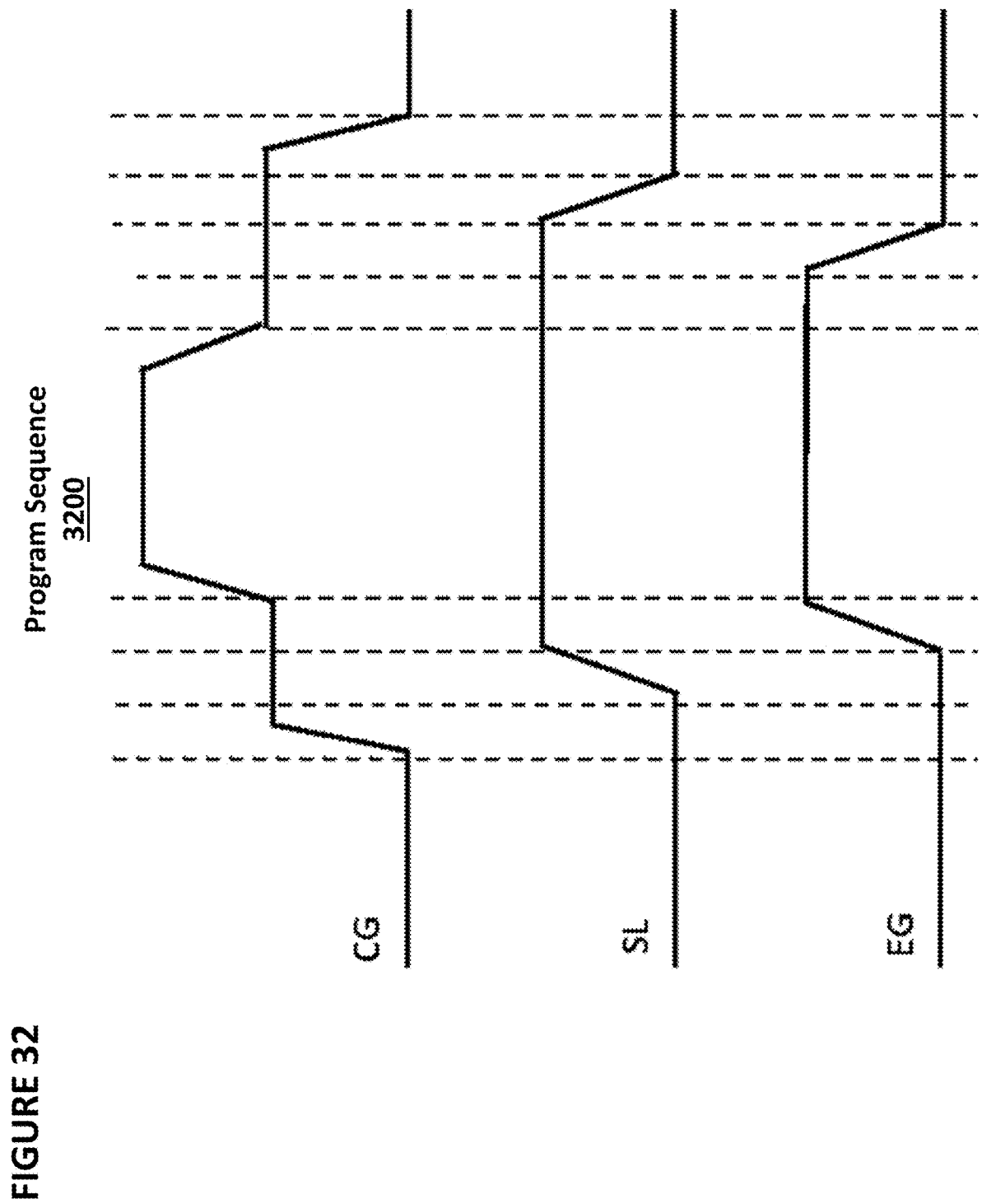
FIG. 32 depicts another program sequence.

FIG. 32 depicts program sequence 3200, where the control gate voltage CG ramps up during a first period to an intermediate value, then the source line voltage SL ramps up during a second period to its peak value, and then the erase gate voltage EG ramps up to a third period to its peak value, and then the control gate voltage CG ramps up during a fourth period to its peak value. All three voltages plateau at their peak values during a fifth period, and then control gate voltage CG ramps down during a sixth period to an intermediate value, erase gate voltage EG ramps down during a seventh period, source line voltage SL ramps down during an eighth period, and control gate voltage CG then ramps down to ground during a ninth period.

Figure 33:
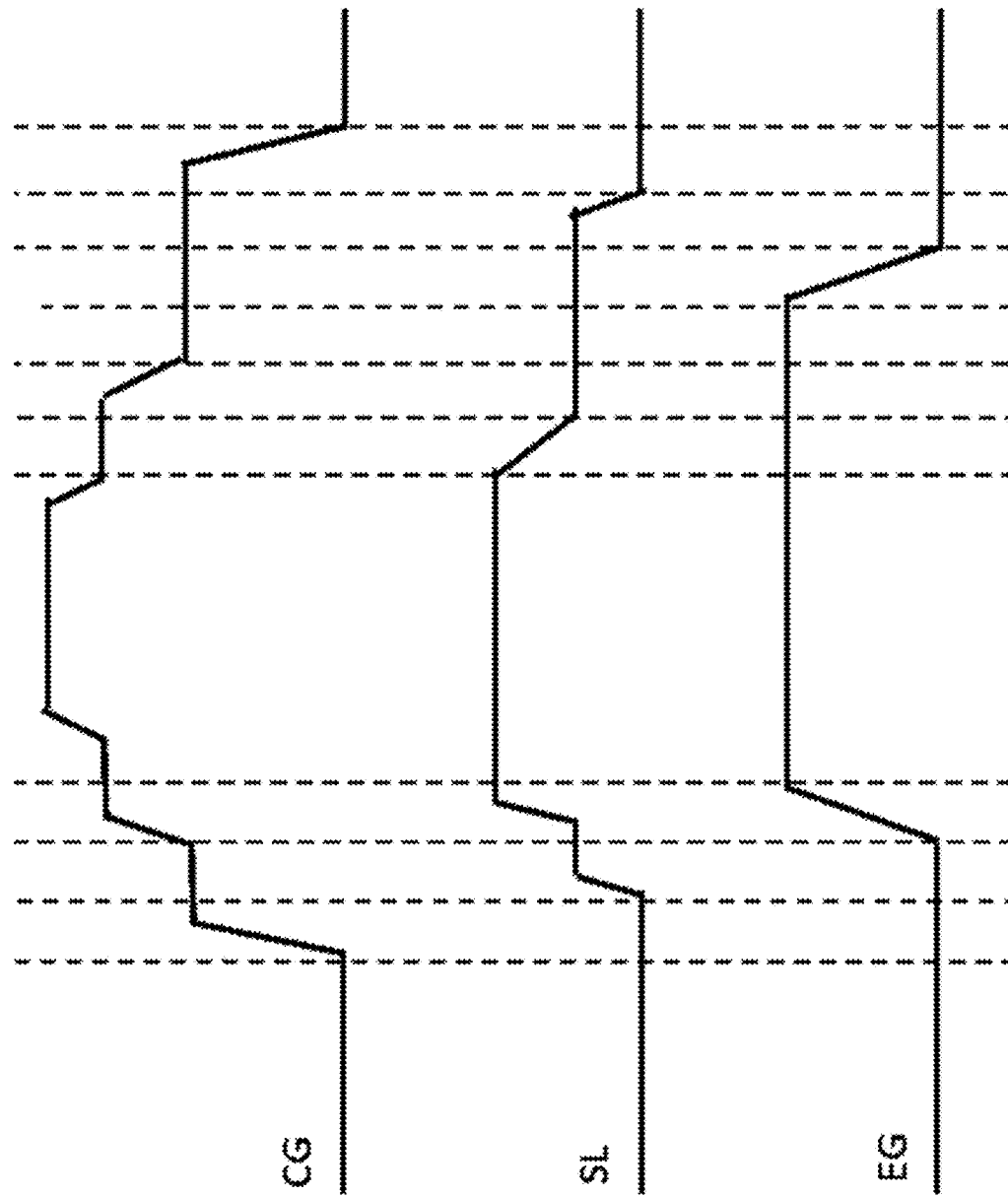
FIG. 33 depicts another program sequence.

FIG. 33 depicts program sequence 3300, where first the control gate voltage CG ramps up to a first intermediate value during a first period and then during a second period the source line voltage SL ramps up to a second intermediate value. Then, during a third period, the control gate voltage CG ramps up to a third intermediate value while the source line voltage SL ramps up to its peak voltage and the erase gate voltage EG ramps to its peak voltage. Finally, during a fourth period, the control gate voltage CG ramps up to its peak voltage. Then all three voltages plateau at their peak values during a fifth period. Then during a sixth period the control gate voltage CG ramps down to the third intermediate value, then during a seventh period the source line voltage SL ramps down to the second intermediate value, then during an eighth period the control gate voltage CG ramps down to the first intermediate value, then during a ninth period the erase gate voltage EG ramps down to ground, then during a tenth period the source line voltage SL ramps down to ground, and then during an eleventh period the control gate voltage CG ramps down to ground.

Figure 34:
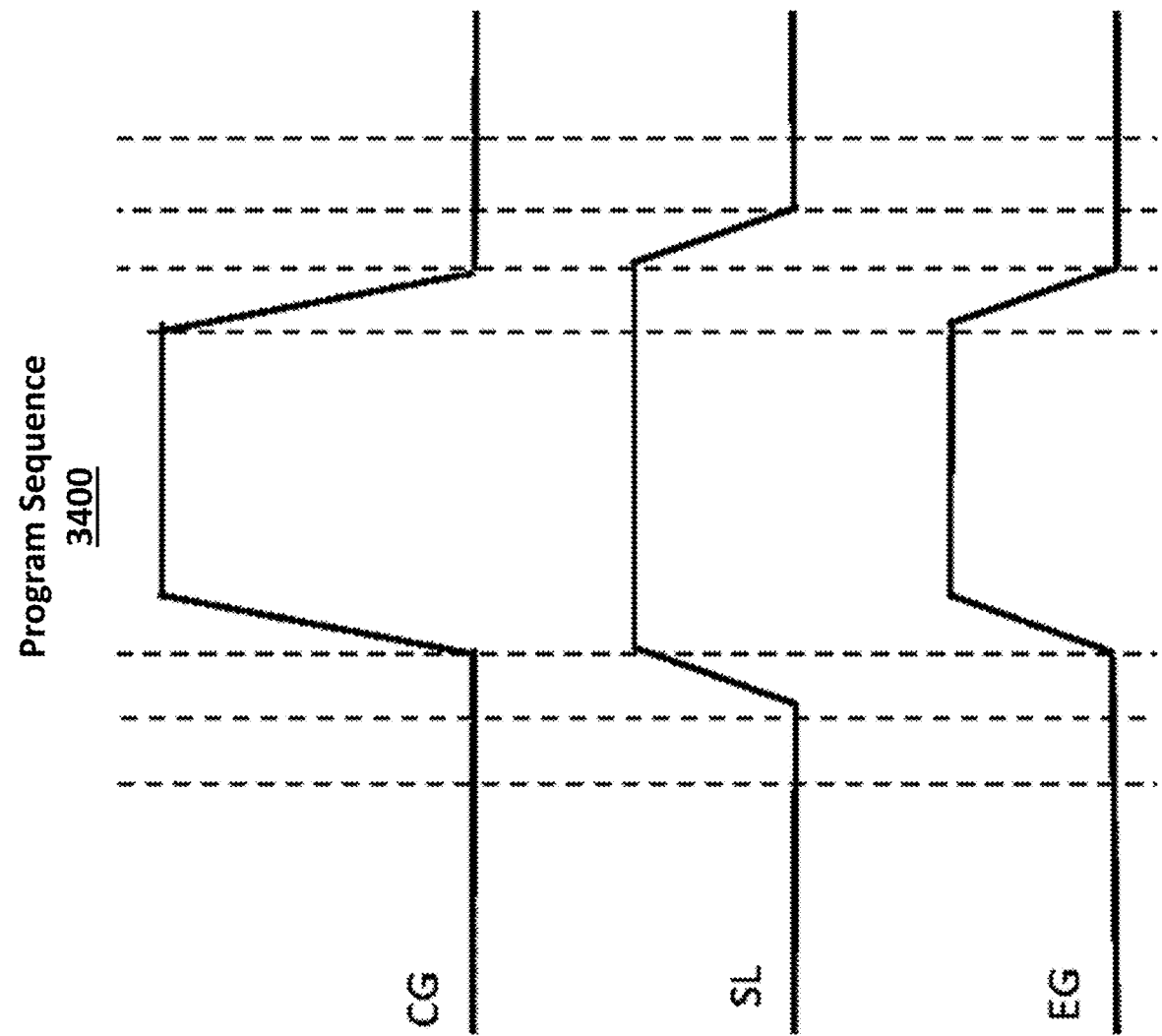
FIG. 34 depicts another program sequence.

FIG. 34 depicts program sequence 3400, where the source line voltage SL ramps up during a first period to a peak value, and then during a second period the control gate line voltage CG ramps up to its peak value while the erase gate voltage EG ramps up to its peak value. Then during a third period all three voltages plateau at their peak values. Then the control gate line voltage CG ramps down during a fourth period while the erase gate voltage EG ramps down, and then during a fifth period the source line voltage SL ramps down. Program sequence 3400 minimizes control gate disturb occurrences.

Figure 35:
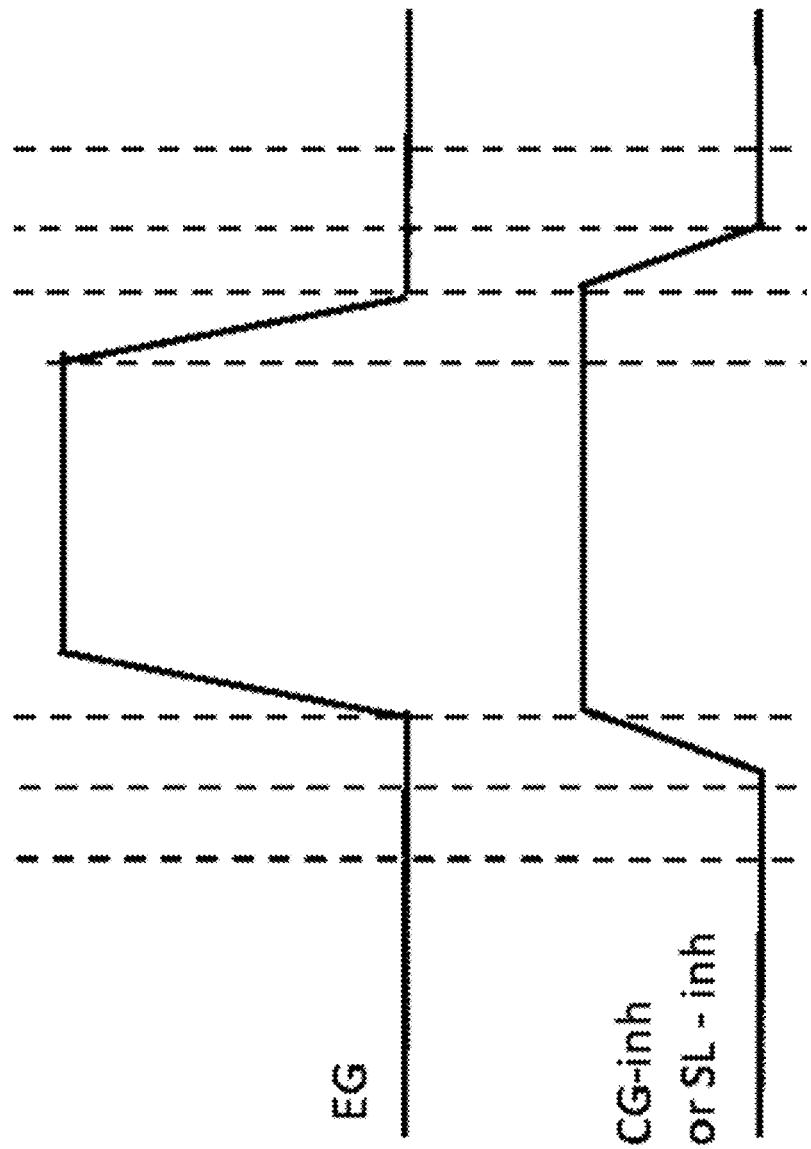
FIG. 35 depicts an erase sequence.

FIG. 35 depicts erase sequence 3500, where the inhibit control gate or inhibit source line (CG-inh or SL-inh, to be applies to unselected cells during an operation) ramps up during a first period, and then erase gate voltage EG ramps up during a second period. Then all voltage plateau at their peak values during a third period. Then the erase gate voltage EG ramp down during a fourth period, and then the inhibit control gate or inhibit source line (CG-inh or SL-inh) ramps down during a fifth period. This sequence is for example suitable for arrays that are suitable for bi-directional tuning such as FIG. 12, 14, 16, 19.

Figure 36C:
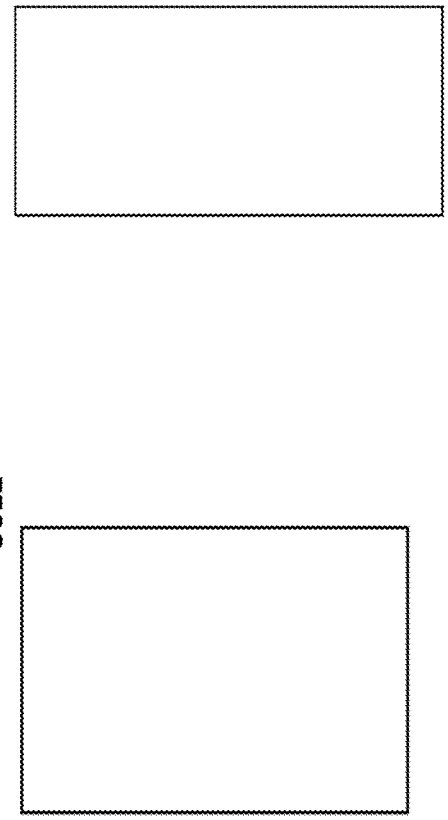
FIGS. 36A-36C depict examples of high voltage decode circuits.
Figure 36B:
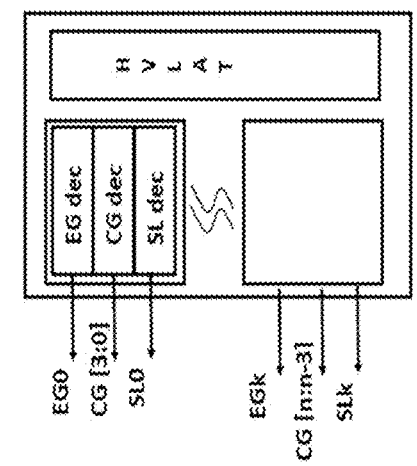
Figure 36A:
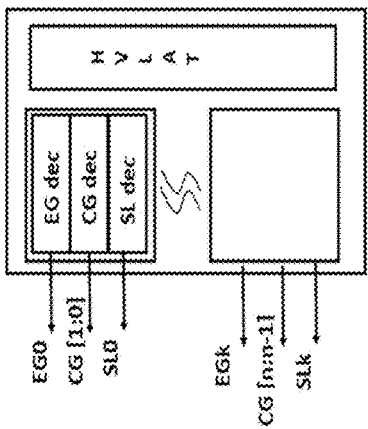

FIGS. 36A, 36B, and 36C depict a high voltage decoder 3600 that utilizes the decoding sub circuit blocks 3001 (EG dec), 3004 (CG dec), 3007 (SL dec) in FIG. 30. Different arrangement of sub circuit blocks are done as shown to optimize for different configurations and optimizations.

FIG. 36A shows circuit decoder block 3601 that comprises circuit decoder block 3602. The circuit decoder block 3602 includes EG dec that provides one EG decoding signal, CG dec that provides two CG decoding signals, and SL dec that provides one SL decoding signal.

FIG. 36B shows circuit decoder block 3611 that comprises circuit decoder block 3612. The circuit decoder block 3612 includes EG dec that provides one EG decoding signal, CG dec that provides four CG decoding signals, and SL dec that provides one SL decoding signal.

FIG. 36C shows circuit decoder block 3621 that comprises circuit decoder block 3622. The circuit decoder block 3622 t includes EG dec that provides two EG decoding signals, CG dec that provides eight CG decoding signals, and SL dec that provides one SL decoding signal.

Figure 37:
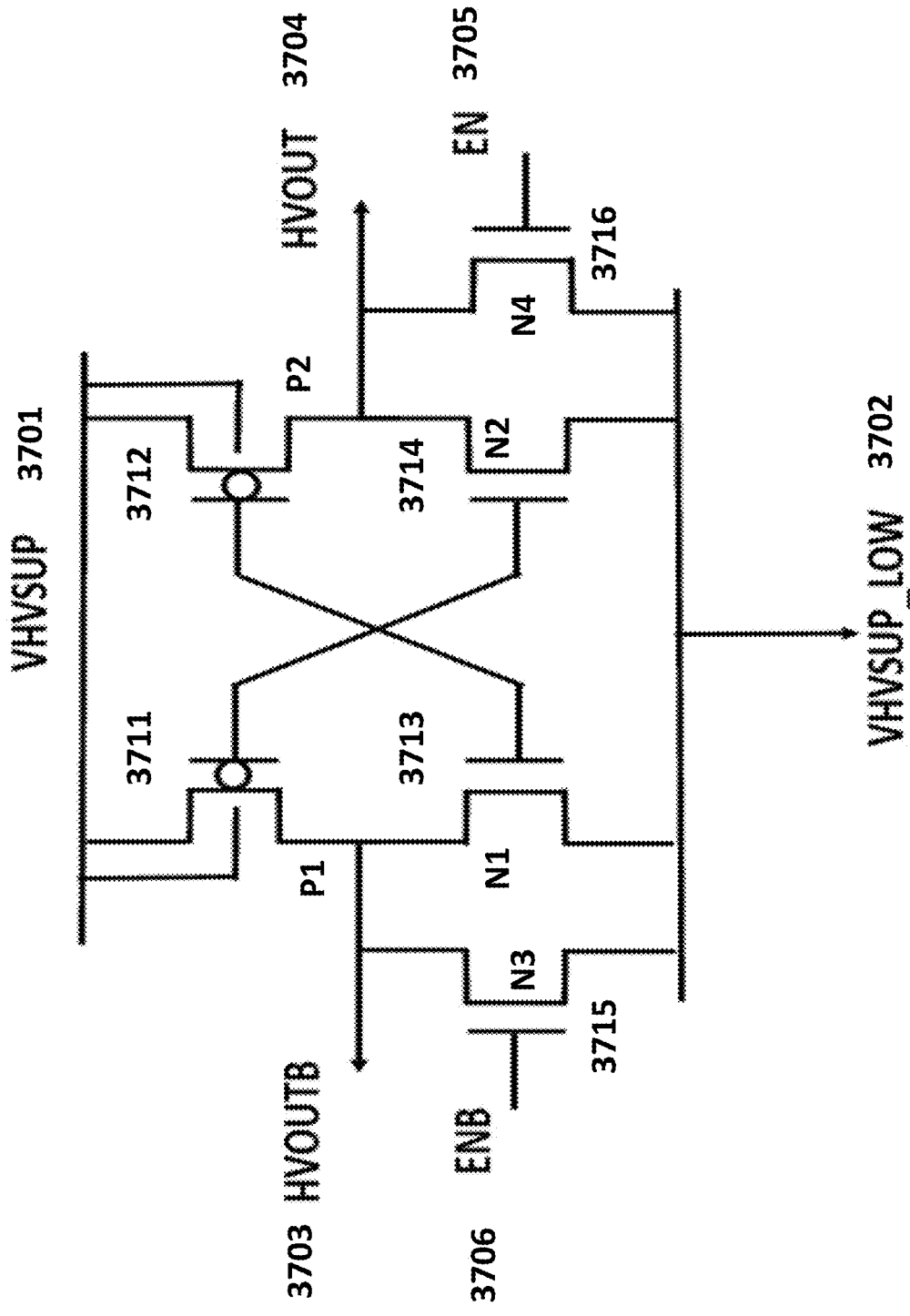
FIG. 37 depicts a high voltage latch circuit.

FIG. 37 depicts high voltage latch circuit 3700. High voltage latch circuit 3700 comprises a cross coupled high voltage transistor inverter formed by PMOS transistors 3711 and 3712 and NMOS transistors 3713 and 3714 and enabling transistors 3715 and 3716. The enabling signals ENB 3706 and EN 3705 are logic signals (e.g., 0V/Vdd) when VHVSUP 3701 is at an intermediate voltage (e.g. ~1.8-5V) and are at another intermediate voltage (e.g., both signals EN 3705=ENB 3706=Vdd=1.8V) when VHVSUP 3701 is at voltage greater than an intermediate HV voltage (e.g., >5V) and when VHVSUP_LOW 3702 is at an intermediate level such as 1.8V. Output HVOUT 3704 and complementary signal HVOUTB 3703 are generated.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method comprising:
   programing a word or page of non-volatile memory cells in an analog neural memory system;
   identifying any fast bits in the word or page of non-volatile memory cells;
   erasing the word or page of non-volatile memory cells;
   programming and verifying fast-bits in the word or page of non-volatile memory cells; and
   programming and verifying non-fast-bits in the word or page of non-volatile memory cells:
   wherein the programming of the fast-bits and the programming of the non-fast-bits utilize different programming sequences.

2. The method of claim 1, wherein the identifying step comprises monitoring a programming rate of each cell in the word or page.

3. The method of claim 1, wherein the identifying step comprises monitoring a current change over time during programming of each cell in the word or page.

4. The method of claim 1, further comprising performing soft programming of the word or page of non-volatile memory cells.

5. The method of claim 1, wherein the programming and verifying non-fast-bits comprises coarse programing of non-fast-bits.

6. The method of claim 5, wherein the programming and verifying non-fast-bits comprises fine programming of non-fast-bits.

7. The method of claim 6, further comprising:
   after the fine programming, performing ultra-fine programming of non-fast-bits.

* * * * *